(12) United States Patent
Boiron et al.

(10) Patent No.: US 12,725,910 B2
(45) Date of Patent: Sep. 1, 2026

(54) METHOD FOR MANUFACTURING CONTACTLESS MODULE HAVING AN ANTENNA COIL WITH FINELY ADJUSTABLE INDUCTANCE

(71) Applicant: SEALSQ FRANCE, Meyreuil (FR)

(72) Inventors: Ghislain Boiron, Aix en Provence (FR); Jean-Pierre Enguent, Aix en Provence (FR)

(73) Assignee: SEALSQ FRANCE, Meyreuil (FR)

( * ) Notice: Subject to any disclaimer, the term of this patent is extended or adjusted under 35 U.S.C. 154(b) by 106 days.

(21) Appl. No.: 18/722,544

(22) PCT Filed: Dec. 12, 2022

(86) PCT No.: PCT/FR2022/052314
§ 371 (c)(1),
(2) Date: Jun. 20, 2024

(87) PCT Pub. No.: WO2023/118684
PCT Pub. Date: Jun. 29, 2023

(65) Prior Publication Data

US 2025/0105491 A1 Mar. 27, 2025

(30) Foreign Application Priority Data

Dec. 24, 2021 (FR) ........................................ 2114517

(51) Int. Cl.
*H01Q 1/22* (2006.01)
*H01Q 7/00* (2006.01)
*H10W 70/60* (2026.01)

(52) U.S. Cl.
CPC ............. *H01Q 1/2283* (2013.01); *H01Q 7/00* (2013.01); *H10W 70/699* (2026.01)

(58) Field of Classification Search
CPC ......... G06K 19/0726; G06K 19/07747; G06K 19/07749; G06K 19/07773;
(Continued)

(56) References Cited

U.S. PATENT DOCUMENTS 6,285,485 B1 * 9/2001 Ferreira ............... G02B 26/085 359/198.1
8,847,373 B1 * 9/2014 Summers ............ B81C 1/00285 257/E23.085

(Continued)

FOREIGN PATENT DOCUMENTS

EP 3016032 A1 5/2016
FR 3105857 A1 7/2021

(Continued)

OTHER PUBLICATIONS

International Search Report and Written Opinion dated Feb. 22, 2023, issued in PCT Application No. PCT/FR2022/052314, filed Dec. 12, 2022.

(Continued)

*Primary Examiner* — Thien M Le
(74) *Attorney, Agent, or Firm* — Workman Nydegger

(57) ABSTRACT

A contactless module includes a microcircuit connected to an antenna coil having a first group of turns, a central area delimited by the contour of an inner turn of the first group of turns, external and internal connection pads of the antenna coil that are formed in the central area of the antenna coil, and a second group of turns within the central area, each turn of the second group of turns including portions of turns that are at variable distances from the turn of preceding rank.

23 Claims, 13 Drawing Sheets

(58) Field of Classification Search
CPC ....... G06K 19/07775; G06K 19/07779; G06K 19/07783; H01L 23/49855; H01Q 1/2283; H01Q 7/00
See application file for complete search history.

(56) References Cited

U.S. PATENT DOCUMENTS

2001/0054601 A1* 12/2001 Ding ................. H01J 37/32467 438/743
2002/0186007 A1* 12/2002 Cao ........................ B82Y 30/00 324/207.16
2009/0294065 A1* 12/2009 Lai ...................... H01J 37/3244 156/345.47
2011/0210811 A1* 9/2011 Scherer ............. G01R 33/3873 29/602.1
2012/0068300 A1* 3/2012 Summers ................ H01L 23/26 257/E21.333
2015/0186769 A1* 7/2015 Boiron ............. G06K 19/07783 29/601
2017/0020402 A1* 1/2017 Rogers ................. A61B 5/0031
2018/0323133 A1* 11/2018 Kirby .................. H01L 23/5227
2020/0035550 A1* 1/2020 Emerson ................. H01L 21/78
2020/0394484 A1 12/2020 Calvas et al.
2021/0406636 A1 12/2021 Calvas et al.
2024/0269473 A1* 8/2024 Rogers ............... A61N 1/37516

FOREIGN PATENT DOCUMENTS

WO 2014/006286 A1 1/2014
WO 2017/191373 A1 11/2017
WO 2019/102079 A1 5/2019
WO 2020/094320 A1 5/2020

OTHER PUBLICATIONS

International Preliminary Report on Patentability dated Jul. 4, 2024, issued in PCT Application No. PCT/FR2022/052314, filed Dec. 12, 2022.

* cited by examiner

B6
10
BA6
T1
EP
IP
14
15
h1
h4
11
13
16
30
h2
h5
b6
b8
L1
L2
L3
L4
L5
L6
h3
h6
b7
A6
12
SS6
L8
L7
r6

W1
EP
W2
M6
IP
h1
h4
CW
h5
h2
MC
CA, RL
h3
h6
A6

METHOD FOR MANUFACTURING CONTACTLESS MODULE HAVING AN ANTENNA COIL WITH FINELY ADJUSTABLE INDUCTANCE

TECHNICAL FIELD

The present invention relates to a contactless module and a method for manufacturing a contactless module of the type comprising a wafer covered on a first face with a first electrically conductive layer in which an antenna coil is formed, the antenna coil including turns of increasing rank from the outside toward the inside of the antenna coil, including an outer turn of rank 1 and an inner turn of rank N, the inner turn being connected to an internal connection pad and the outer turn being connected to an external connection pad, and a microcircuit attached to the first face of the wafer, in a central area of the antenna coil delimited by a turn of the antenna coil, and including first connection terminals connected to connection pads of the antenna coil via wires.

STATE OF THE ART

A contactless module as defined hereinbefore and a method for manufacturing such a contactless module are disclosed by WO 2014/006286 A1. An example of such a contactless module M1 is depicted in FIG. 1. The contactless module M1 comprises a wafer B1 covered on a first face, or rear face, with an electrically conductive layer wherein an antenna coil A1 was formed. The antenna coil A1 includes N turns of increasing rank from the outside toward the inside of the antenna coil, herein eight turns L1 to L8, including an outer turn L1 of rank 1 and an inner turn of rank N, in this case L8. The inner coil L8 is connected to an internal connection pad IP and the outer coil L1 is connected to an external connection pad EP. A microcircuit MC is attached to the rear face of the wafer B1 in a central area of the antenna coil A1 delimited by the contour of the inner turn L8, and includes first connection terminals, or antenna connection terminals, connected to the connection pads EP, IP of the antenna coil via wires W1, W2. The outer turn L1 follows the entire contour of the antenna coil A1, with the exception of an area allowing the passage of a conductive track T1 connecting the outer turn to the external connection pad EP. The connection pads EP, IP are formed in the central area of the antenna coil, the antenna coil comprising a bypass area BA1 in which each turn L1 to L8 bypasses the external connection pad EP via the central area.

In the context of the manufacture of a so-called "dual-interface" contactless module M1 with two communication modes, contact and contactless, the wafer B1 also comprises, on its other face, or front face, a second electrically conductive layer in which contact pads are formed, for example six ISO 7816-type contact pads (not shown). The wafer B1 is then provided with holes h allowing the passage of wires CW connecting second connection terminals of the microcircuit MC, or connection terminals of the contact mode, to all or part of these contact pads.

Wiring by means of wires W1, W2, CW is generally carried out by ultrasonic bonding of the wire ends to the surfaces to be interconnected. This wiring technique, generally referred to as "ultrasonic wire bonding", preferably requires the microcircuit to be mounted "flat", that is to say, parallel to the surface of the wafer B1, so that the plane in which the connection terminals of the microcircuit extend is parallel to the plane in which the connection pads EP, IP of the antenna extend, and to the plane in which the contact pads extend on the other face of the module.

To this end, a support structure SS1 is provided at the center of the coil, to support the microcircuit over its width and part of its length, the microcircuit also being supported over its width and another part of its length by turns of the antenna coil in the bypass area BA1. The support structure SS1 herein includes a conductive path that is part of the inner turn L8. Transverse conductive sections form, on either side thereof, two comb-like structures making it possible to support the microcircuit across its entire width.

After mounting and wiring the microcircuit MC on the module, the microcircuit is embedded in an electrically insulating resin layer RL, which extends over the central area of the antenna coil and covers the connection wires W1, W2 and CW, to ensure the perfect mechanical strength thereof.

Such an antenna structure offers a number of advantages, and especially that of shortening the length of the wire W1 connecting the microcircuit to the external connection terminal EP of the antenna coil, so that this connection wire is covered by the resin layer RL without the need for the latter to cover the entire module. Indeed, as explained in WO 2014/006286 A1, the module M1 is generally intended to be mounted in a cavity formed in a card, which comprises two depths. The first depth allows the cavity to receive the periphery of the module M1. The second depth is equal to the first depth plus the thickness of the resin layer RL, and allows the cavity to receive the part of the module M1 covered by the resin layer RL. To avoid weakening the card, it is desirable for the surface area of the module covered by the resin layer RL to be minimal, so that the region of the cavity having the second depth is also minimal. This minimal surface area corresponds substantially to the central region of the coil in which the microcircuit MC and the wires W1, W2, CW extend.

Another example M2 of a conventional contactless module is depicted in FIG. 2. The contactless module M2 comprises an antenna coil A2 and has the same general characteristics as the module M1. It differs from the module M1 in that it includes no support structure, with the bypass area, referred to herein as BA2, occupying the center of the antenna coil A2. Thus, the microcircuit MC rests over its entire length and its entire width on portions of turns located in the bypass area. As previously, this antenna coil structure allows the microcircuit MC to be mounted "flat" on the wafer B1.

As shown in FIG. 3, such an antenna coil A1 or A2, when connected to the terminals of the microcircuit MC, forms, together with an internal capacitor IC of the microcircuit, a resonant circuit RLC that needs to be adjusted to a specific resonant frequency, with:

"C" the capacitance of an antenna capacitor internal to the microcircuit MC,

"R" the value of a serial resistance Rm of the antenna coil, as seen by the microcircuit. This serial resistance is shown schematically in the figure as two resistances Rm1, Rm2 in series, "L" the value of an inductance Lm of the antenna coil, as seen by the microcircuit.

The configuration and optimization of a contactless module requires the antenna coil to be designed so as to achieve a certain value of the resonant circuit RLC, and this value may depend on the card into which the module is to be inserted and the intended application for that card. The design of the antenna coil for obtaining the desired values L and R, taking into account the capacitance C of the microcircuit, involves simulation tools using various variables, especially:

- the number of turns and the length of the turns of the antenna coil, for a surface of the module imposed by a set of specifications,
- the distance between turns and the width of the turns, the sum of these two values forming what is commonly known as the pitch of the antenna coil, and
- the thickness of the conductive layer and therefore the thickness of the turns.

The resistance Rm is a resulting parameter that depends on the length of the turns that make up the antenna coil, their width and their thickness, and is equal to the product of the resistivity of the conductive layer in which the turns are etched by the length of the turns divided by their cross-sectional area. Constraining parameters are imposed by rules for etching the turn ("process constraints") and for minimal conduction of the turns ("electrical constraints"). In particular, the thickness of the turns must be greater than the thickness of the skin of the material of which they are made, e.g. 18 micrometers with copper turns and a working frequency of 13.56 MHz. Furthermore, the capacitance C of the antenna capacitor CI integrated in the microcircuit MC is likely to vary based on the microcircuit used and the intended application.

As a result, the conventional antenna coil structure described hereinbefore may not allow fine-tuning of the values of L and R simply by varying the number of turns, for a predetermined pitch and thickness of the turns. It might therefore be desirable to perfect such an antenna coil structure in a way that allows its inductance to be more finely tuned at the design stage.

In other cases, it may be desirable to provide an antenna coil structure that can be used with several types of microcircuits MC of which the internal capacitance C is likely to vary in large proportions. Several antenna coil structures and several types of modules then have to be manufactured, which increases the cost of producing a set of modules. It may therefore be desirable to provide a configurable antenna coil structure that can be used with different microcircuits, to reduce the design and manufacturing costs.

Disclosure of the Invention

The present invention relates to a method for manufacturing a contactless module, comprising the steps of: depositing a first electrically conductive layer on a first face of a wafer, forming an antenna coil by etching the first layer, the antenna coil including turns of increasing rank from the outside toward the inside of the antenna coil, including an outer turn of rank 1 and an inner turn of rank N, the inner turn being connected to an internal connection pad and the outer turn being connected to an external connection pad, attaching a microcircuit to the first face of the wafer, in a central area of the antenna coil delimited by a turn of the antenna coil, and connecting first connection terminals of the microcircuit to connection pads of the antenna coil, via wires. The first layer is etched in such a way that the external and internal connection pads of the antenna coil are formed in the central area of the antenna coil, the antenna coil comprising a bypass area in which each turn bypasses the external connection pad via the central area. The first layer is etched in such a way that the antenna coil comprises a first group of turns of ranks 1 to E, having substantially the same distance between turns, the turn of rank E being the inner turn of the first group of turns, E being at least equal to 4. The central area is delimited by the contour of the inner turn of the first group of turns, and the antenna coil comprises a second group of at least two turns of ranks E+1 to N, which extends inside the central area, each turn of the second group of turns comprising portions of turns which are at variable distances from the turn of preceding rank, said distances being comprised between said distance between turns and several times the distance between turns.

According to one embodiment, the method comprises depositing a second electrically conductive layer on a second face of the wafer, forming contact pads in the second layer, and forming two rows of two or three holes each in the wafer, until reaching the contact pads of the second layer, the rows of holes being substantially perpendicular to a longitudinal axis of the module, and the first layer is etched in such a way that all or part of the turns of the second group follow a path that passes between at least two holes of at least one row of holes.

According to one embodiment, the microcircuit is supported in whole or in part by at least the inner turn of the antenna coil and may also be supported by at least one turn portion of the first group of turns extending in the bypass area.

According to one embodiment, the conductive layer is etched so as to include a support structure for supporting all or part of the microcircuit, the support structure being electrically connected to the inner turn of the antenna coil.

According to one embodiment, at least one part of the support structure forms a conductive path that is part of the inner turn of the antenna coil.

According to one embodiment, the conductive layer is etched so as to form, in the bypass area, at least one pad for connecting to a turn of rank greater than 1 of the first group of turns.

According to one embodiment, the method comprises a step consisting in connecting a first one of the first connection terminals of the microcircuit to the connection pad of a turn of rank greater than 1 of the first group of turns.

According to one embodiment, the conductive layer is etched so as to form, in the central area, at least one pad for connecting to a turn of rank lower than N of the second group of turns.

According to one embodiment, the method comprises a step consisting in connecting a second one of the first connection terminals of the microcircuit to the connection pad of a turn of rank lower than N of the second group of turns.

According to one embodiment, the method comprises a step of depositing an electrically insulating protective layer on the microcircuit and the connection wires.

According to one embodiment, the wafer belongs to a board in which several contactless modules are collectively formed, the method comprising a step of cutting the board to individualize the modules, carried out after connection of each microcircuit.

According to one embodiment, the method comprises a step of designing the antenna coil comprising a step of determining at least one target value of the inductance and one target value of the resistance of the antenna coil as they should be seen from the first connection terminals of the microcircuit, a step of designing the first group of turns and the second group of turns in such a way that the inductance and the resistance of the antenna coil as seen from connection pads of the antenna coil are close to the intended target values.

According to one embodiment, the method comprises a step of designing the antenna coil comprising a step of determining a plurality of target values of the inductance and of target values of the resistance of the antenna coil as they should be seen from the first connection terminals of the microcircuit, a step of designing the first group of turns and the second group of turns, comprising the provision of several pads for connecting to turns of different ranks of the first group of turns and/or the second group of turns, such that the antenna coil has several pairs of connection pads, each pair of connection pads comprising a pad for connecting to a turn of the first group of turns and a pad for connecting to a turn of the second group of turns, the design of the first and second groups of turns and the choice of the location of the connection terminals being such that the inductance and resistance of the antenna coil as seen from each pair of connection pads of the antenna coil are close to one of the values of the plurality of target values of the inductance and of target values of the resistance of the antenna coil.

The invention also relates to a method for manufacturing a microcircuit card comprising the steps that consists in carrying out the previously disclosed method, in order to obtain a contactless module, form an antenna coil in a card, and implant the module in the card, the antenna coil of the card having at least one turn close to the antenna coil of the microcircuit in order to establish inductive coupling between the two antenna coils.

The invention also relates to a contactless module, comprising a wafer covered on a first face with a first electrically conductive layer in which an antenna coil is formed, the antenna coil including turns of increasing rank from the outside toward the inside of the antenna coil, including an outer turn of rank 1 and an inner turn of rank N, the inner turn being connected to an internal connection pad and the outer turn being connected to an external connection pad, a microcircuit attached to the first face of the wafer, in a central area of the antenna coil delimited by a turn of the antenna coil, and including first connection terminals connected to connection pads of the antenna coil via wires, the external and internal connection pads of the antenna coil being formed in the central area of the antenna coil. The antenna coil comprises a bypass area in which each turn bypasses the external connection pad via the central area, a first group of turns of ranks 1 to E having substantially the same distance between turns, the turn of rank E being the inner turn of the first group of turns, E being at least equal to 4, the central area being delimited by the contour of the inner turn of the first group of turns. The antenna coil also comprises a second group of at least two turns of ranks E+1 to N, which extends inside the central area, each turn of the second group of turns comprising portions of turns which are at variable distances from the turn of preceding rank, said distances being comprised between said distance between turns and several times the distance between turns.

According to one embodiment, the wafer comprises contact pads on a second face of the wafer, two rows of two or three holes each, made in the wafer, reaching the contact pads on the second face, the rows of holes being substantially perpendicular to a longitudinal axis of the module, and all or part of the turns of the second group of turns follow a path that passes between at least two holes of at least one row of holes.

According to one embodiment, the microcircuit is supported in whole or in part by at least the inner turn of the antenna coil and may also be supported by at least one turn portion of the first group of turns extending in the bypass area.

According to one embodiment, the conductive layer includes a support structure for supporting all or part of the microcircuit, the support structure being electrically connected to the inner turn of the antenna coil.

According to one embodiment, at least one part of the support structure forms a conductive path that is part of the inner turn of the antenna coil.

According to one embodiment, the antenna coil comprises, in the bypass area, at least one pad for connecting to a turn of rank greater than 1 of the first group of turns.

According to one embodiment, a first one of the first connection terminals of the microcircuit is connected to the connection pad of a turn of rank greater than 1 of the first group of turns.

According to one embodiment, the antenna coil comprises, in the central area, at least one pad for connecting to a turn of rank lower than N of the second group of turns, to which a second one of the first connection terminals of the microcircuit is connected or can be connected.

The invention also relates to a microcircuit card comprising an antenna coil and a contactless module as previously described, the antenna coil of the card having at least one turn close to the antenna coil of the module, in order to establish inductive coupling between the two antenna coils.

BRIEF DESCRIPTION OF THE FIGURES

Exemplary embodiments of contactless modules and methods for manufacturing such contactless modules will be described in what follows, by way of non-limiting example in relation to the accompanying figures, among which.

the previously described

DETAILED DESCRIPTION

Figure 1:
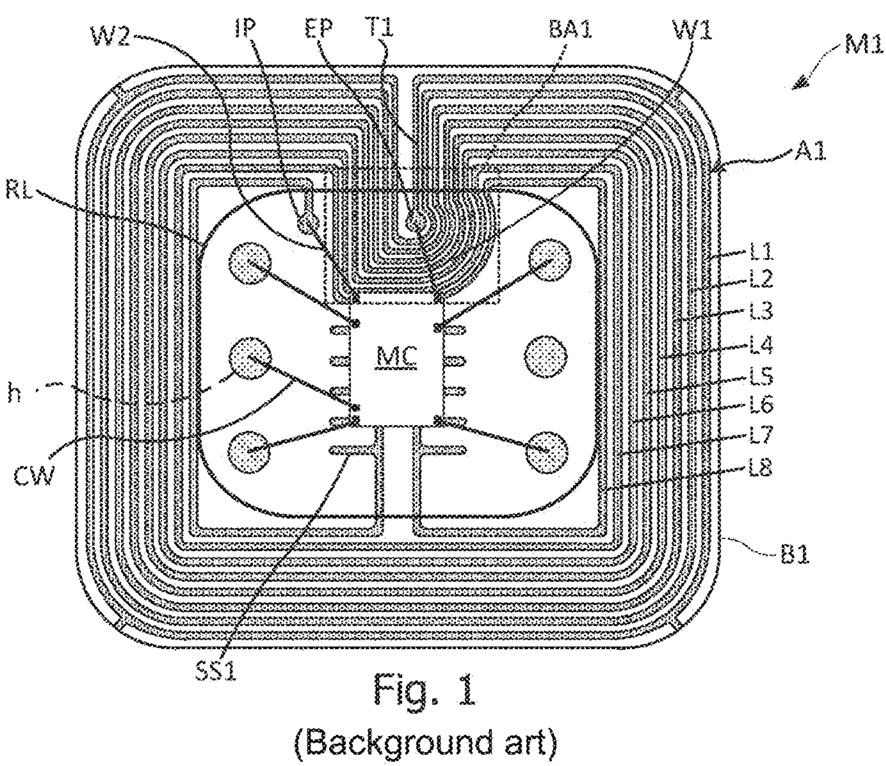
FIG. 1 shows a conventional contactless module, the previously described
Figure 2:
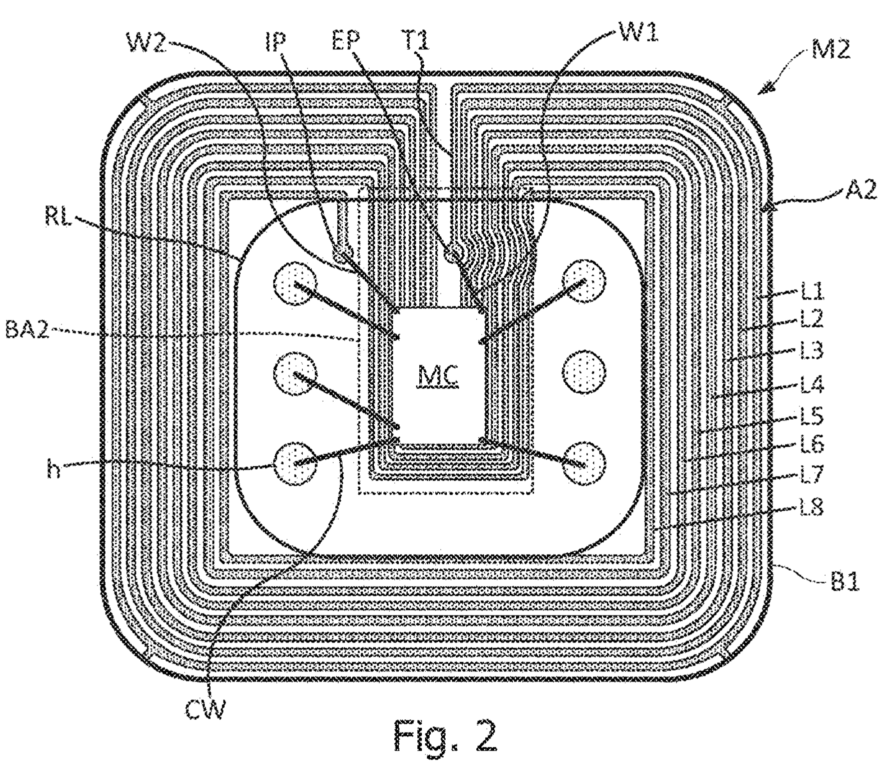
FIG. 2 shows another conventional contactless module.
Figure 3:
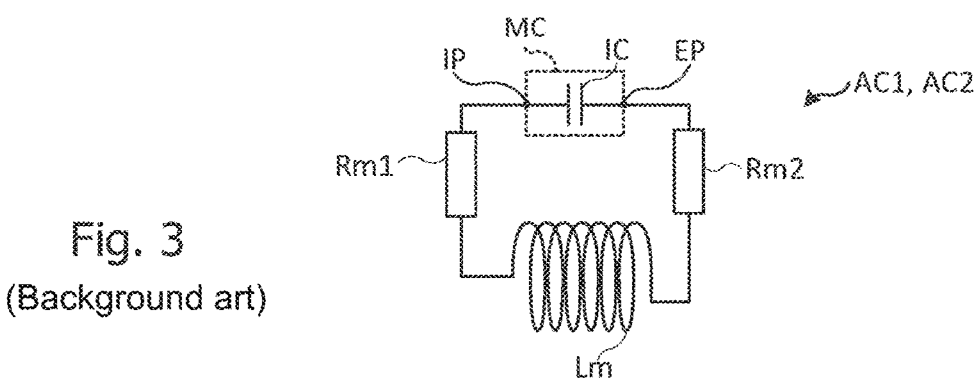
FIG. 3 is the wiring diagram of an antenna circuit for the contactless module of FIG. 1 or FIG. 2.
Figure 5:
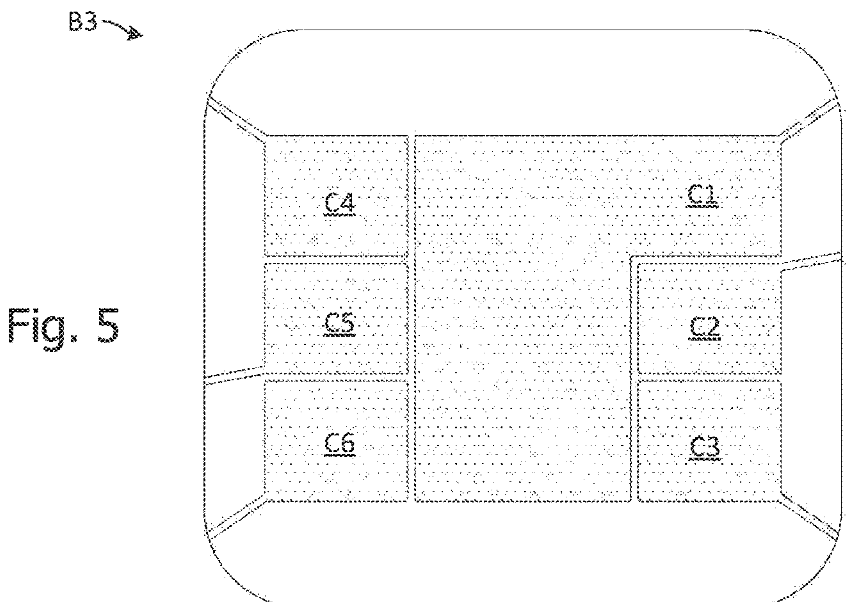
FIG. 5 shows the front face of the wafer of FIG. 4A.
Figures 4A, 4B:
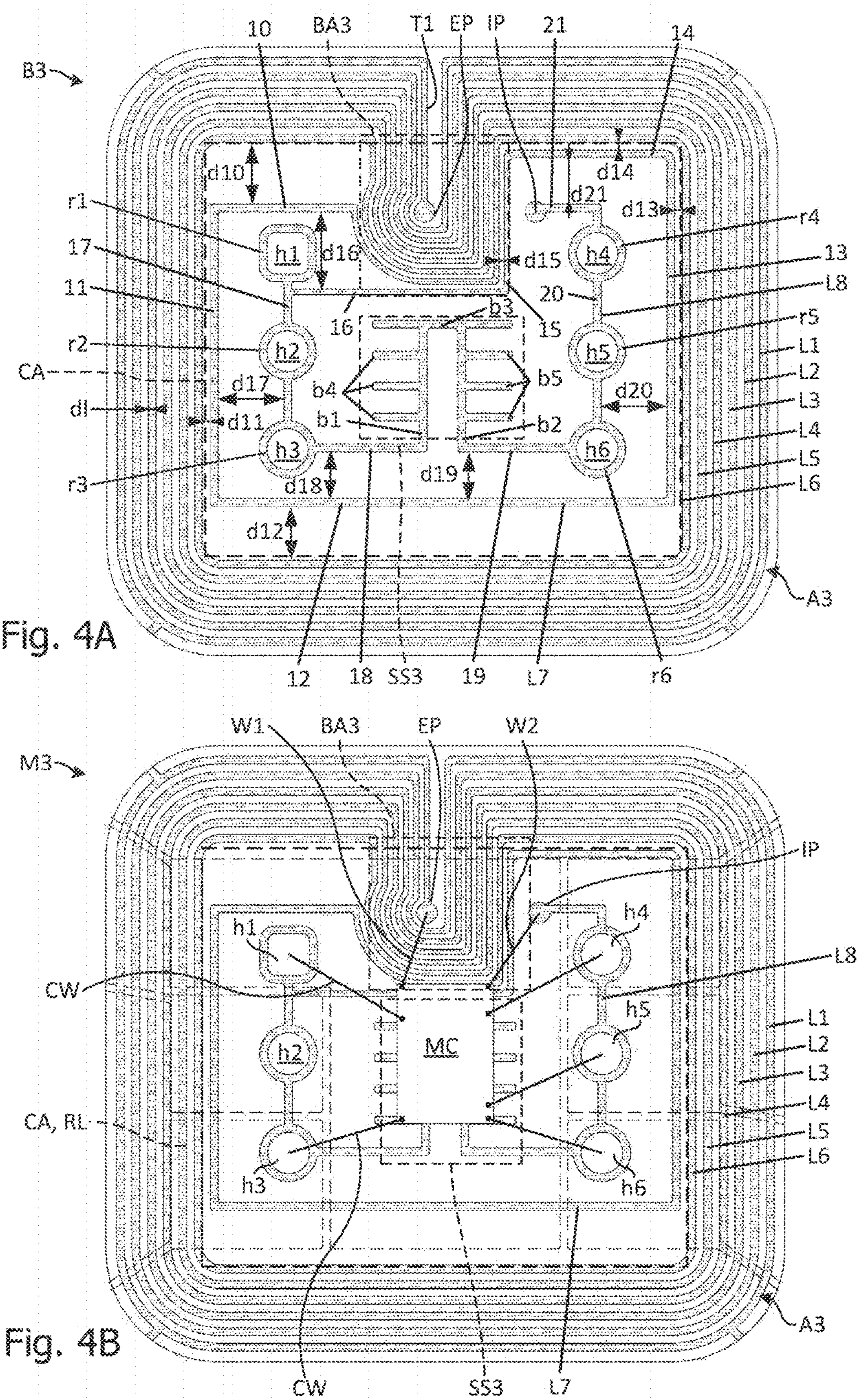
FIG. 4A shows the rear face of a first embodiment of a wafer of a contactless module.
FIG. 4B shows the rear face of a contactless module formed from the wafer of FIG. 4A.

FIG. 4A shows the rear face of a wafer B3 of a contactless module, and FIG. 5 shows the front face of the wafer B3. The wafer is made of an electrically insulating material, for example epoxy, and has a front face and a rear face. Each face is covered with a conductive layer, hereinafter referred to as the "front conductive layer" and the "rear conductive layer". The rear conductive layer was etched to form an antenna coil A3 (FIG. 4A) and the front conductive layer was etched to form contact pads C1-C6 (FIG. 5). The thickness of the wafer B3 is, for example, of the order of a hundred micrometers, and its dimensions are, for example, of the order of 13×11.8 mm. The two conductive layers are made of copper, for example. In some embodiments, the copper can be covered with a finishing layer made of nickel, gold, palladium or a stack of these materials. The nickel is generally used to prevent copper oxidation. The gold is generally used to improve the electrical conductivity of the conductive layers. The palladium can be used to improve the visual appearance of the conductive layer on the front face (silvery appearance). The copper/nickel/gold combination is the one most commonly used in the industry, and more rarely the copper/nickel/gold/palladium combination. In general terms, the wafer B3, as well as all the wafers described hereinafter, can be produced using any current or future technology for depositing a conductive layer on a rigid or flexible substrate, and for etching the conductive layer. A method for the collective manufacture of a plurality of wafers is especially disclosed hereunder.

The contact pads C1 to C6 (FIG. 5) on the front face are, for example, ISO 7816-compliant contact pads, and comprise five active contact pads (Vcc, Clock, GND, RST, I/O) and one contact pad reserved for future use (RFU) or specific to certain applications. The wafer M also includes holes h1 to h6 made from the rear face and opening onto the rear face of the contact pads C1 to C6 on the front face, without passing through them. These holes can be formed before or after depositing the conductive layers. They form two rows—h1, h2, h3 and h4, h5, h6, respectively—of three holes each. According to the manufacturing method used, the rear face of the wafer B3 may include conductive flanges, or conductive rings r1 to r6, which extend around the holes h1 to h6 and are formed during the etching step of the rear conductive layer in order to form the antenna coil A3.

The antenna coil A3 (FIG. 4A) has a structure in accordance with a first improvement and will now be described in detail. The antenna coil A3 includes N turns of increasing rank from the outside toward the inside of the antenna coil, herein eight turns L1 to L8, i.e. N=8. Turn L1 of rank 1 is the outer turn and turn L8 of rank 8 is the inner turn of the antenna coil. The inner coil L8 is connected to an internal connection pad IP and the outer coil L1 is connected to an external connection pad EP. In accordance with the teaching of WO 2014/006286 A1, the connection pads EP, IP are formed in a central area CA of the antenna coil, the antenna coil comprising a bypass area BA3 in which each turn L1 to L8 bypasses the external connection pad EP via the central area CA. The outer turn L1 follows the entire contour of the antenna coil, with the exception of an area allowing the passage of a conductive track T1 connecting the external connection pad EP to the outer turn L1. In such an antenna coil A3 structure, a distinction is thus made between the "contour" of the antenna coil, which is defined by the general shape of the outer turn L1 without taking into account the bypass area BA3, and the "outside" of the outer turn L1, which includes the track T1 connecting the outer turn L1 to the external connection pad EP. The bypass area BA3 and the central area CA are shown as dotted lines in FIG. 4A. The bypass area BA3 extends into the central area CA, which includes the connection terminals EP, IP of the antenna coil.

Optionally, the wafer B3 also comprises a support structure SS3 to ensure flatness when mounting a microcircuit on the wafer. The support structure SS3 is substantially TT-shaped and comprises a first branch b1 and a second branch b2 parallel to each other, and a third, transverse branch b3 connecting the branches b1, b2. It also includes three branches b4 parallel to the branch b3 and connected to the branch b1, and three branches b5 parallel to the branch b3 and connected to the branch b2. The branches b1, b2 and the part of the branch b3 that connects the branches b1, b2 herein form an integral part of the conductive path forming the inner turn L8.

According to the first improvement, the antenna coil:

- comprises a first group of turns of ranks 1 to E, herein the turns L1 to L6, i.e. E=6, having substantially the same distance between turns dl, the turn of rank E, herein the turn L6, being the inner turn of the first group of turns,
- the central area CA of the antenna coil is delimited by the contour of the inner turn of rank E of the first group of turns, herein the turn L6. "Delimited by the contour of the inner turn of rank E" relates to the fact that the central area is delimited by the overall shape of the turn of rank E, disregarding the bypass area, which extends inside the central area and therefore comprises portions of turns of the first group of turns belonging to the bypass area.
- the antenna coil comprises a second group of at least two turns with ranks ranging from E+1 to N, E+1 herein being equal to 7, which extend inside the central area CA. The second group of turns herein comprises the turns L7 and L8.
- each turn of the second group of turns, herein L7 and L8, comprises portions of turns that are at variable distances from the turn of the previous rank, herein the turn L6 for the turn L7 and the turn L7 for the turn L8. These distances are comprised between the distance between turns and several times the distance between turns dl of the first group of turns.

In this example, the turn L7 comprises portions of turns 10 to 14. The portion 10 comprises a section of curved conductive track belonging to the bypass area BA3 followed by a straight track section leading away from the bypass area and at a distance d10 from the turn L6. The portion 11 is a straight track section perpendicular to the section 10 and at a distance d11 from the turn L6. The portion 12 is a straight track section perpendicular to the section 11 and at a distance d12 from the turn L6. The portion 13 is a straight track section perpendicular to the section 12 and at a distance d13 from the turn L6. The portion 14 is a straight track section perpendicular to the section 13 and at a distance d14 from the turn L6. The portion 15 is a straight track section perpendicular to the section 14 and at a distance d15 from the turn L6. The distances d11, d13, d14 and d15 are equal to the distance between turns dl of the first group of turns. The distances d10 and d12 are several times greater than the distance dl.

The turn L8 comprises portions 16 to 21. The portion 16 is a straight track section leading away from the bypass area, until it is at a distance d16 from the portion 10 of the turn L7. The portion 17 comprises a straight track section at a distance d17 from the portion 11 of the turn L7, and two conductive rings r2 and r3 surrounding the holes h2 and h3. The portion 18 is a straight track section located at a distance d18 from the portion 12 of the turn L7 and attached to the branch b1 of the support structure SS3. The portion 19 is a straight track section located at a distance d19 equal to d18 from the portion 12 of the turn L7 and attached to the branch b2 of the support structure SS3. The portion 20 comprises three straight track sections located at a distance d20 from the portion 13 of the turn L7, and three conductive rings r4, r5, r6 extending around the holes h4, h5, h6. The portion 21 is a straight track section located at a distance d21 from the portion 14 of the turn L7, terminating at the internal connection terminal IP of the antenna coil. The distances d16, d17, d18, d19, d20 and d21 are each several times greater than the distance between turns dl. The border of the hole h1 also comprises a conductive ring r1 attached to the portion 16 but which is not part of the conductive path of the turn L8. As mentioned above, the branches b1, b2 and the part of the branch b3 that connects the branches b1, b2 of the support structure SS3 herein form an integral part of the turn L8.

FIG. 4B shows a contactless module M3 made from the wafer B3. A microcircuit MC was attached to the wafer by means of an electrically insulating adhesive. First microcircuit connection terminals, or antenna connection terminals, were connected by wires W1, W2 to the connection pads EP, IP of the antenna coil A3. Second microcircuit connection terminals, or contact mode connection terminals, were connected to the contact pads C1 and C3 to C6 on the front face (FIG. 5) by wires CW passing through the holes h1, h3 to h6, which reach the rear face of these contacts without passing through them. The microcircuit MC rests over part of its length and its entire width on the support structure SS3 and over another part of its length and its entire width on portions of turns in the bypass area, herein a portion of the turn L7 and the portion 1 of the turn L8. The central area CA of the antenna coil A3, delimited herein by the contour of the turn L6, was covered with a resin layer RL providing mechanical protection for the wires. In practice, and depending on the tolerances of the encapsulation process, this resin layer may not coincide exactly with the central area CA, and may comprise a safety border that extends over one or more turns of the first group of turns.

Figure 6:
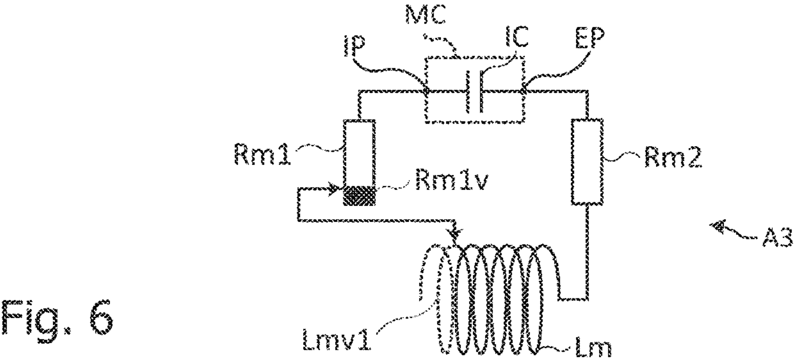
FIG. 6 is the wiring diagram of an antenna circuit for the contactless module shown in FIG. 4B.

According to the present improvement, the turns of the second group of turns, herein L7, L8, have a complex shape that can be varied at the discretion of the designer, offering additional leeway in the antenna coil design to fine-tune its inductance to a desired value, while adjusting the value of its serial resistance. As shown in FIG. 6, once connected to the microcircuit, the antenna coil A3 forms, with an internal capacitor IC of the microcircuit MC, a resonant circuit RLC that can be adjusted to a given resonant frequency, with:

- "C" the capacitance of an internal capacitor of the microcircuit MC (antenna capacitor),
- "R" the value of a serial resistance Rm of the antenna coil, as seen by the microcircuit, represented by two resistances Rm1, Rm2 in series,
- "L" the value of an inductance Lm of the antenna coil, as seen by the microcircuit.

Lmv1 depicts part of the antenna coil inductance that can be varied according to the shape given to the turns L7, L8, and Rm1*v* depicts the part of the resistance of the antenna coil that can be varied according to the shape given to the turns L7, L8. The design of the turns L7, L8, and in general of the turns of the second group, therefore offers an additional degree of freedom for obtaining a desired value of the resonant circuit RLC, in addition to conventional design variables such as the number of turns and the length of the turns of the first group of turns, the distance between turns and the width of the turns, the thickness of the conductive layer and therefore the thickness of the turns, etc.

FIG. 4B shows a contactless module M3 made from the wafer B3. A microcircuit MC was attached to the wafer. The first connection terminals of the microcircuit were connected by wires W1, W2 to the connection pads EP, IP of the antenna coil A3. The second terminals of the microcircuit were connected by wires CW passing through the holes h1, h3 to h6 to the contact pads C1 and C3 to C6 on the front face (FIG. 5). The microcircuit rests over part of its length and its entire width on the support structure SS3 and over another part of its length and its entire width on portions of turns in the bypass area, herein part of the portion 10 of the turn L7 and part of the portion 16 of the turn L8. The central area CA of the antenna coil A3, delimited herein by the contour of the turn L6, is covered with a resin layer RL providing mechanical protection for the wires. As mentioned above, this resin layer may not coincide exactly with the central area, CA and may comprise a safety border.

Figure 7A:
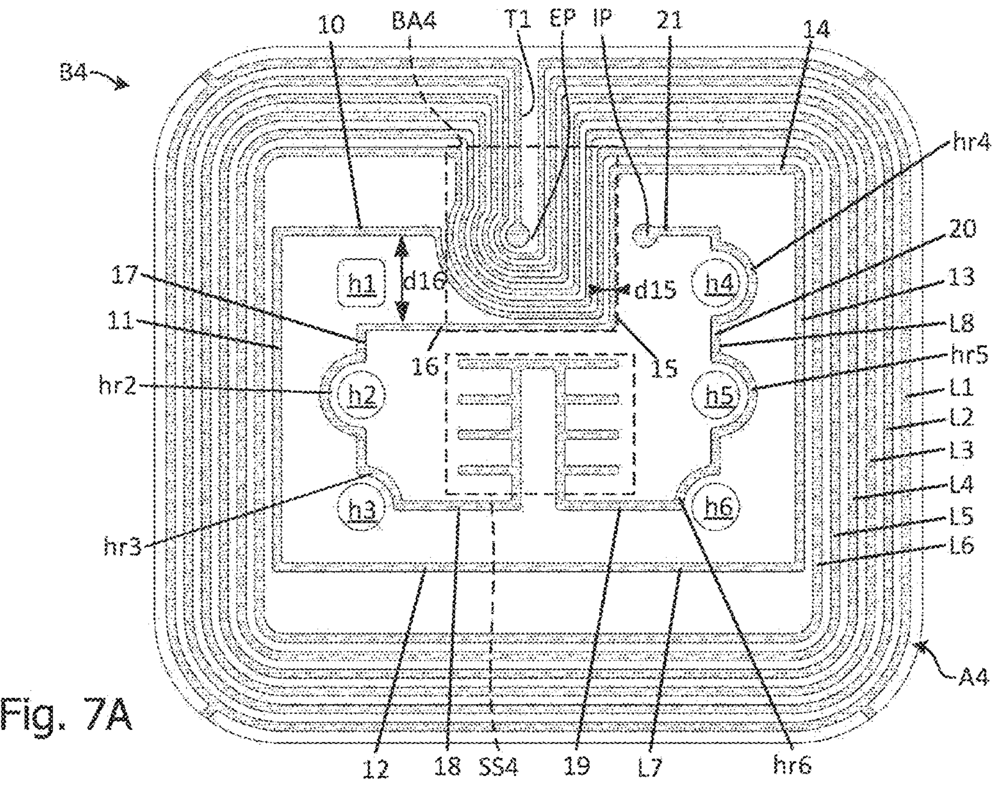
FIG. 7A shows the rear face of a variant of the wafer of FIG. 4A.

FIG. 7A shows a variant B4 of the wafer B3 comprising an antenna coil A4 of the same general structure as the antenna coil A3, with a support structure SS4 identical to the support structure SS3 and a bypass area BA4 identical to the bypass area BA3. The antenna coil A4 differs from the antenna coil A3 in that the periphery of the holes h1 to h6 is devoid of conductive rings. In this case, the portion 17 of the turn L8 comprises, instead of conductive rings, a semi-circular track section hr2 which bypasses the hole h2, and a quarter-circular track section hr3 which bypasses the hole h3. Similarly, the portion 20 of the turn L8 comprises a quarter-circular section of conductive track hr6 that bypasses the hole h6, a semi-circular track section hr5 that bypasses the hole h5, and a semi-circular track section hr4 that bypasses the hole h4.

Figure 7B:
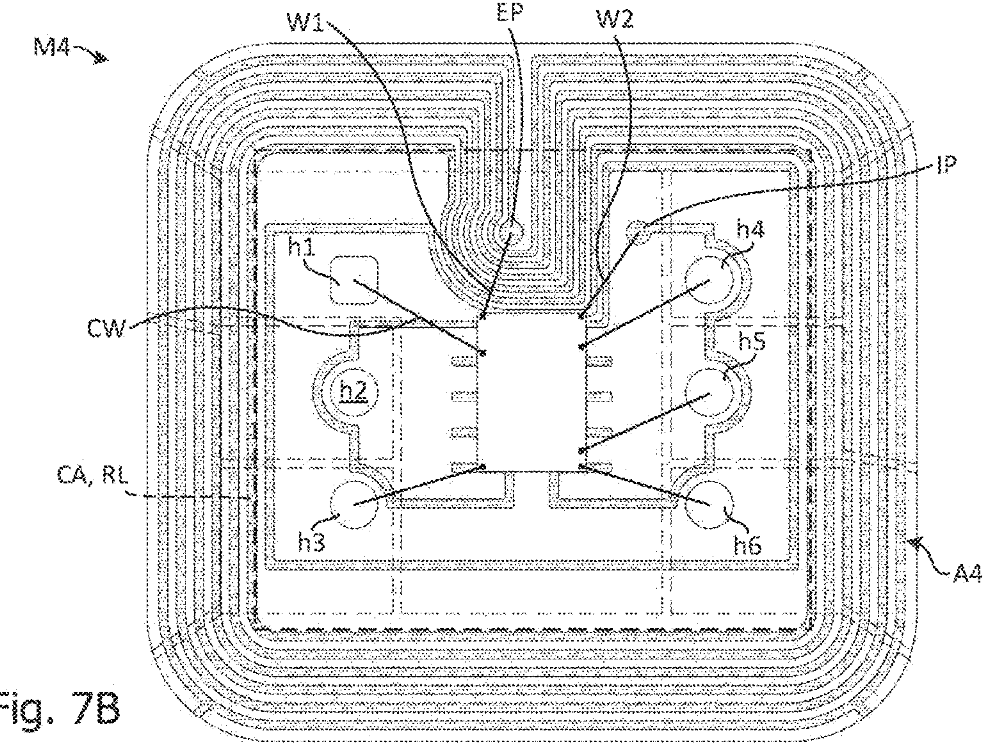
FIG. 7B shows the rear face of a contactless module formed from the wafer of FIG. 7A.

A contactless module M4 made with the wafer B4 is shown in FIG. 7B. The contactless module M4 is identical to the contactless module M3, except for the differences just mentioned, and the description of the contactless module M3 hereinbefore applies to the contactless module M4.

Figure 8A:
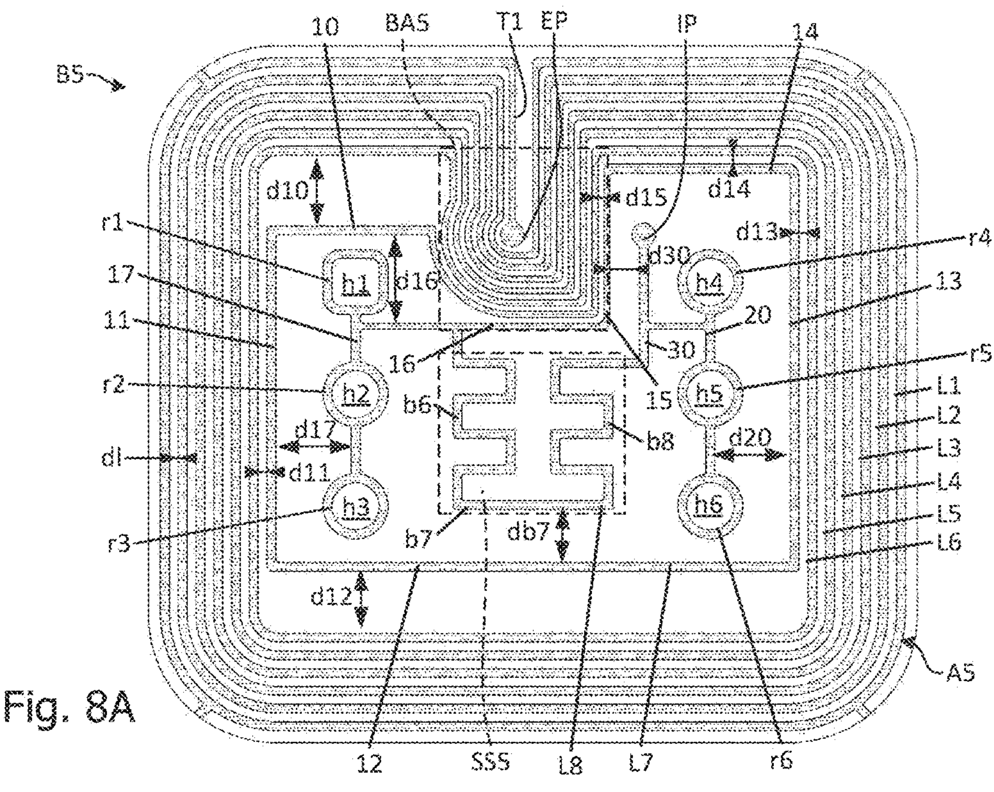
FIG. 8A shows the rear face of another variant of the wafer of FIG. 4A.

FIG. 8A shows a variant B5 of the wafer B3, comprising an antenna coil A5 in which the first group of turns comprises turns L1 to L6 and the second group of turns comprises turns L7 and L8. The turns L1 to L6 of the first group, and the turn L7 of the second group, are identical to the turns L1 to L7 of the antenna coil A3 of the wafer B3, and the bypass area BA5 is identical to the bypass area BA3.

The wafer B5 herein comprises a support structure SS5 comprising branches b6, b7, b8, the branches b6 and b8 being slot-shaped and the branch b7 connecting the branches b6 and b8.

The turn L7 comprises the portions of turns 10 to 15 already described. The turn L8 comprises the portion 16 already described, the branches b6, b7, b8 of the support structure SS5 and a portion of turn 30. The portion 16 is attached to a termination of the branch b6, and the portion 30 is a straight track section attached to a termination of the branch b8, which terminates at the internal connection pad IP of the antenna coil.

The wafer B5 also comprises the portion 17 and the previously described conductive rings r1, r2, r3, which are connected to the portion 16, but herein are no longer are part of the conductive path of the turn L8. Similarly, the portion 20 and the previously described conductive rings r4, r5, r6 are connected to the portion 30 but herein are no longer part of the conductive path of the turn L8.

Figure 8B:
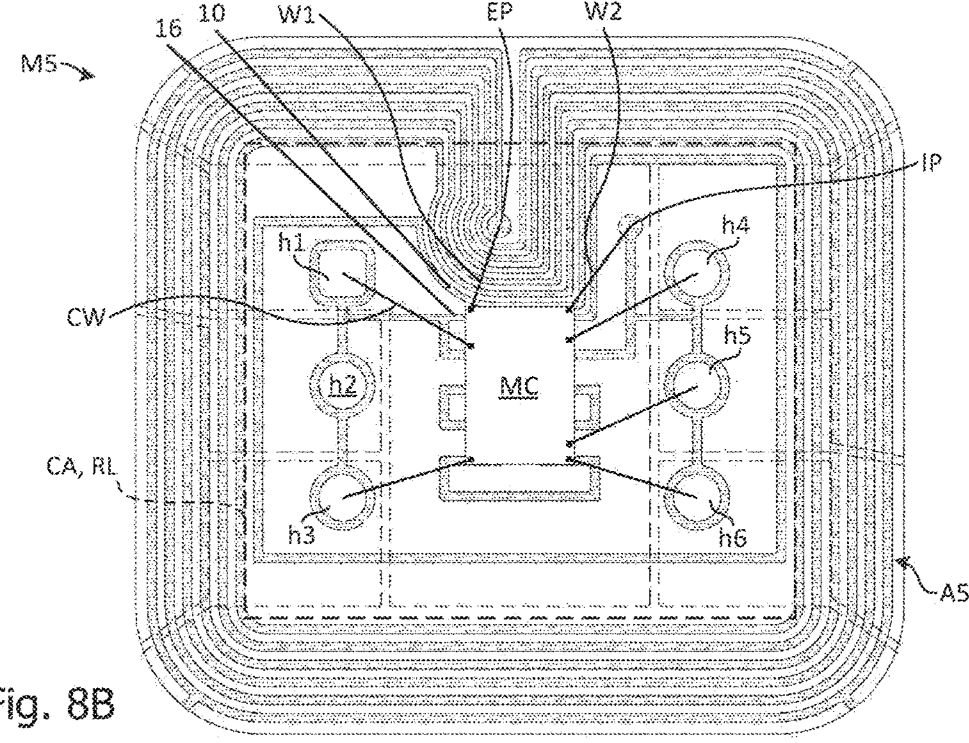
FIG. 8B shows the rear face of a contactless module formed from the wafer of FIG. 8A.

FIG. 8B shows a contactless module M5 made from the wafer B5. Like previously, the first connection terminals of a microcircuit MC were connected by wires W1, W2 to the connection pads EP, IP of the antenna coil A5, and second connection terminals of the microcircuit were connected by wires passing through the holes h1, h3 to h6 to the contact pads C1 and C3 to C6 on the front face (FIG. 5). The microcircuit rests over part of its length and its entire width on the support structure SS5 and over another part of its length and full width on a part of the portion 16 of the turn L8 and a part of the portion 10 of the turn L7. The central area CA of the antenna coil A5, delimited herein by the contour of the turn L6, was covered with a resin layer RL providing mechanical protection for the wires.

Figures 9A, 9B:
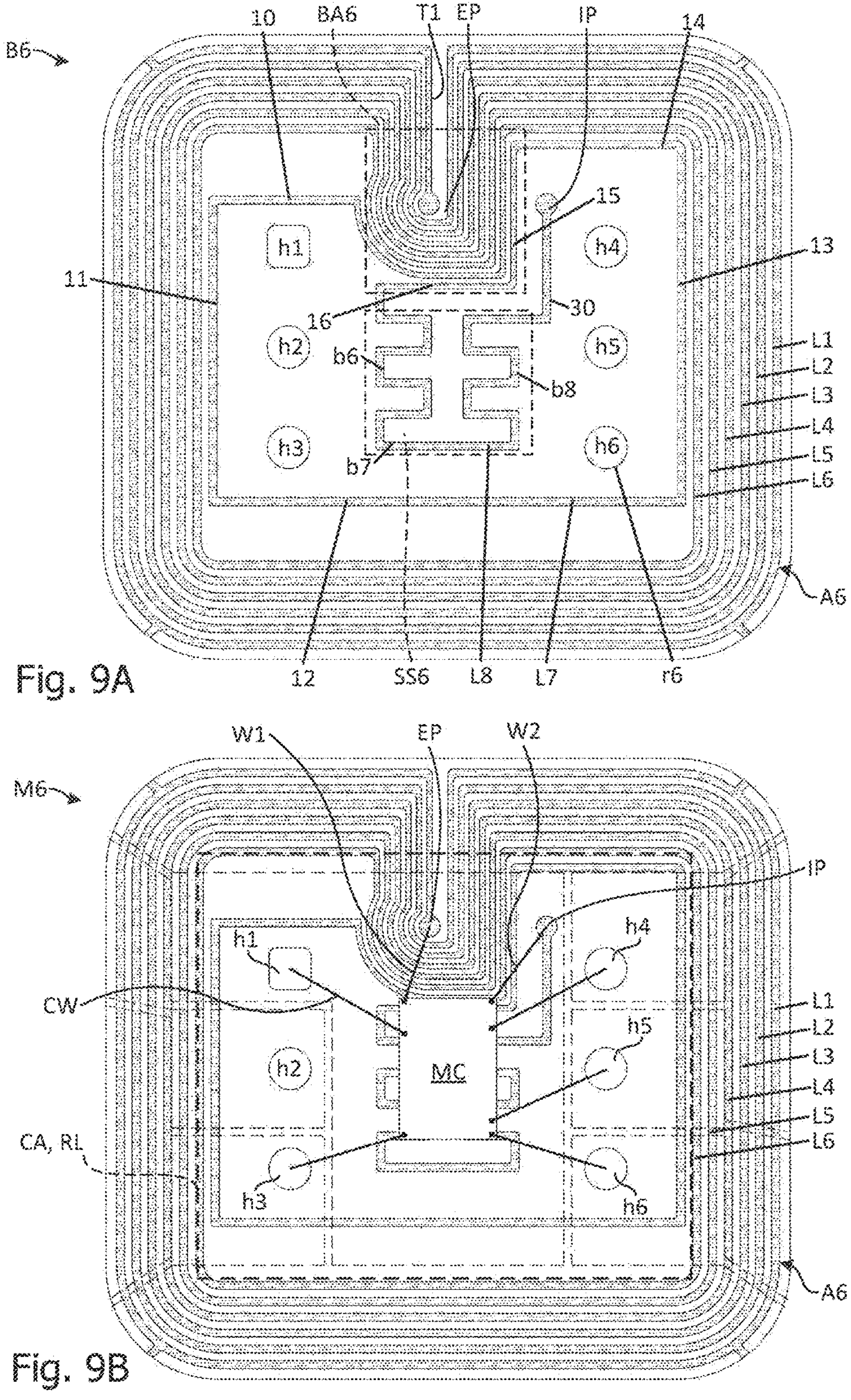
FIG. 9A shows the rear face of yet another variant of the wafer of FIG. 4A.
FIG. 9B shows the rear face of a contactless module formed from the wafer of FIG. 9A.

FIG. 9A shows a variant B6 of the wafer B5 comprising an antenna coil A6 of the same general structure as the antenna coil A5, with a support structure SS6 identical to the support structure SS5 and a bypass area BA6 identical to the bypass area BA5. The wafer B6 differs from the wafer B5 in that the periphery of the holes h1 to h6 is devoid of conductive rings. In this case, the portion 17 and the conductive rings r1, r2, r3, and the portion 20 and the conductive rings r4, r5, r6, previously described as not being part of the conductive path of the turn L8, are removed.

A contactless module M6 made with the wafer B6 is shown in FIG. 9B. The contactless module M6 is identical to the contactless module M5, except for the differences just mentioned, and the description of the contactless module M5 hereinbefore applies to the contactless module M6.

Figure 10:
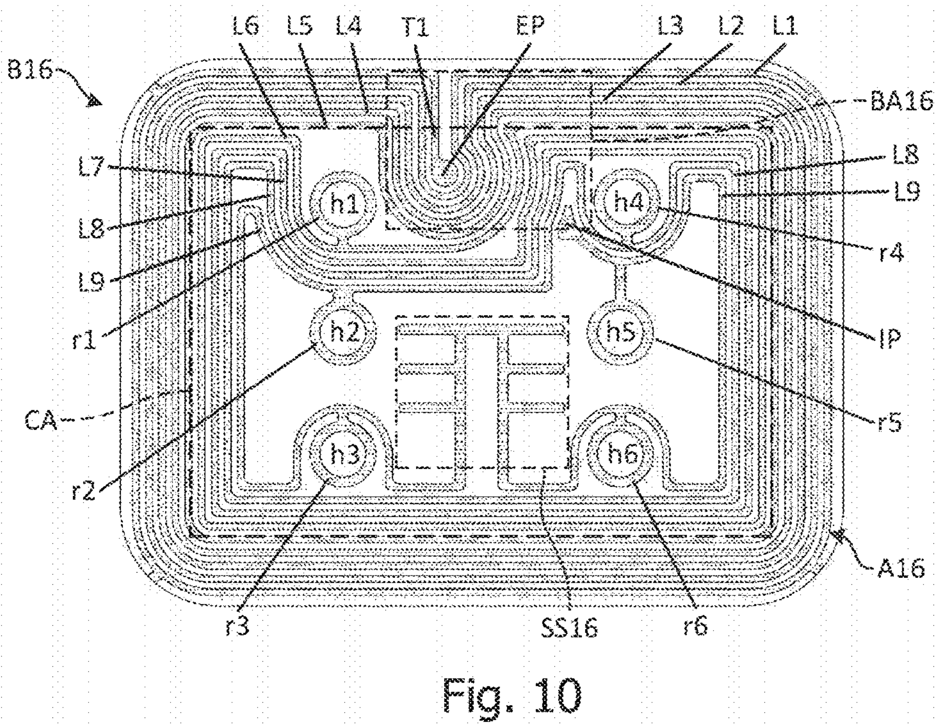
FIG. 10 shows the rear face of yet another variant of the wafer of FIG. 4A, FIGS. 11A and 11B are identical and show the rear face of a second embodiment of a wafer of a contactless module.

An antenna coil according to the first improvement can come in several variants other than those described in the foregoing. By way of illustration, FIG. 10 shows an example of applying the first improvement to a wafer B16 having dimensions of the order of 11×8.32 mm. The wafer B16 comprises an antenna coil A16 comprising a first group of turns L1 to L5 spaced apart by the distance between turns dl disclosed hereinbefore, a second group of turns comprising turns L6 to L9 having variable distances relative to the turns of preceding ranks, a substantially π-shaped support structure SS16 of the type disclosed hereinbefore. The wafer B16 also comprises conductive rings r1 to r6 extending around the holes h1 to h6, the holes h1 to h6 forming a first row of holes h1 to h3 and a second row of holes h4 to h6, each row being perpendicular to a longitudinal axis of the module. In some embodiments, the holes may not be perfectly aligned. Their alignment axis can then be defined as an axis that passes as close as possible to the center of each hole. This axis may not be perfectly perpendicular to the longitudinal axis of the module, and the expression "perpendicular" is thus understood to mean "substantially perpendicular". In the case of a substantially square module, the longitudinal axis of the module will be defined as an axis perpendicular to a longitudinal axis of the microcircuit MC, the rows of holes therefore being parallel to the longitudinal axis of the microcircuit, or substantially parallel to this axis.

According to an optional but advantageous aspect of the first improvement, applicable especially to a module comprising the previously disclosed holes, the turns L6, L7, L8 move away from the turn L5 after the bypass area BA16 in order to pass between the holes h1 and h2 and their conductive rings r1, r2, and then return to the vicinity of the turn L6 with a distance between turns equal to dl. The turn L9 then moves away from the turn L8 to bypass the hole h3 and its conductive ring r3, before extending into the support structure SS16. On leaving the support structure SS16, the turn L9 bypasses the hole h6 and its conductive ring r6, then passes between the holes h4, h5 and their conductive rings in order to reach the connection pad IP. The turn L8 also follows a path that passes between the holes h4, h5 and their conductive rings.

The conductive rings r1, r3, r5, r6 are connected to the turn L9, and the conductive ring r4 is connected to the turn L8, but they are not part of the conductive paths of these turns. The central area CA is delimited by the contour of the turn L6, and the external connection pad EP is located in the central area like previously.

In practice, the first group of turns generally comprises at least four turns, to cover the needs of known applications under technological implementation conditions corresponding to the current state of the art, but the first improvement is not necessarily limited to this minimal number of turns of the first group.

Figure 11A:
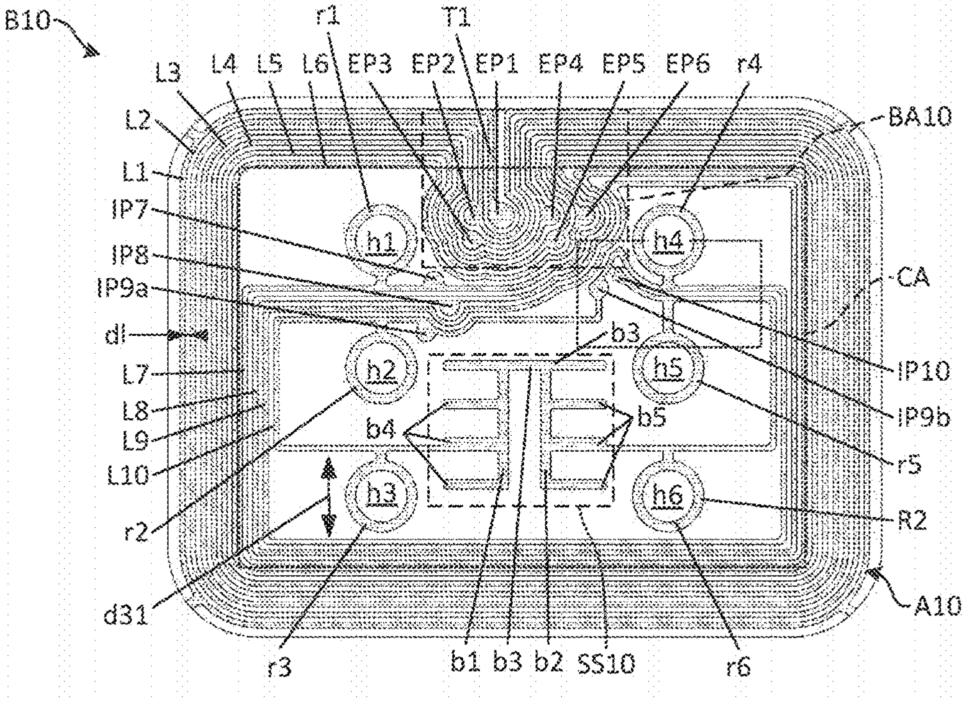
FIG. 11C shows the rear face of a contactless module formed from the wafer of FIG. 11A.
FIG. 11D shows the rear face of another contactless module formed from the wafer of FIG. 11A.
Figure 11B:
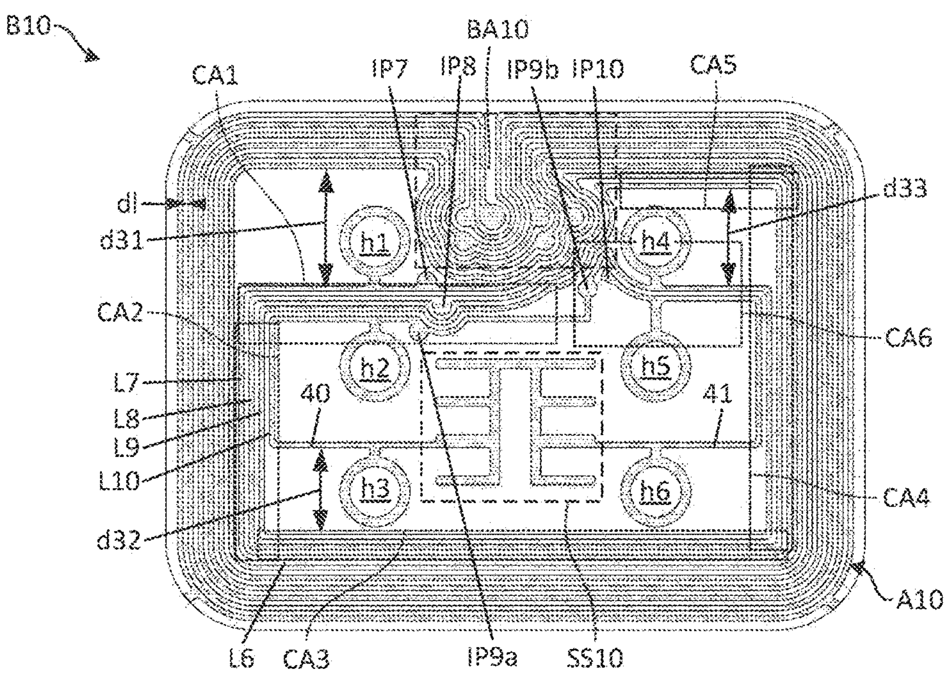
Figure 12:
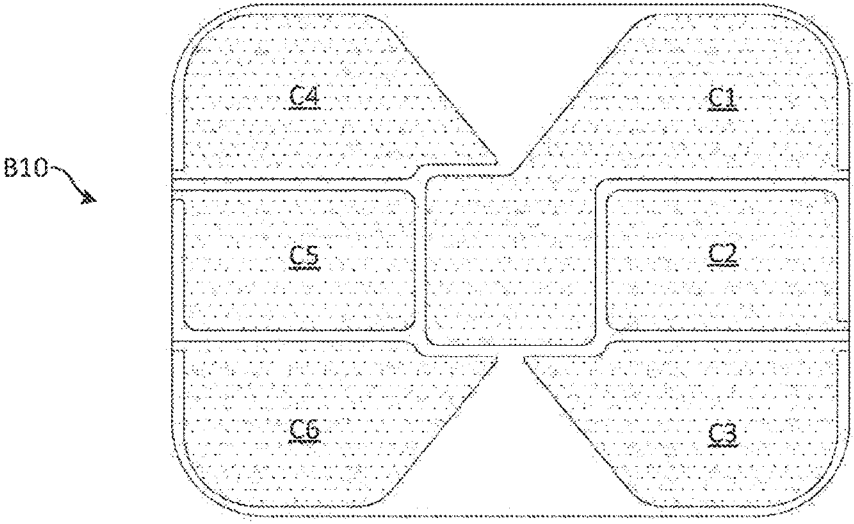
FIG. 12 shows the front face of the wafer of FIG. 11A.

FIGS. 11A, 11B show the rear face of a wafer B10 implementing the first improvement and the second improvement. The two figures are identical, but FIG. 11B shows references of elements that are not shown in FIG. 11A, for reasons of legibility of FIG. 11A. FIG. 12 shows the front face of the wafer B10. The latter comprises six contact pads C1 to C6, for example ISO 7816 contact pads. Its dimensions are, for example, 11×8.32 mm.

Referring to FIGS. 11A, 11B, the rear face of the wafer B10 comprises ten turns (N=10) divided into a first group of six turns L1 to L6 (E=6) and a second group of four turns L7 to L10. The turns of the first group of turns L1 to L6 have substantially the same distance between turns dl, the contour of turn L6 delimiting a central area CA within which an external connection pad EP1 of the antenna coil and an internal connection pad IP10 of the antenna coil are formed. The external connection pad enables a connection to the turn L1, and the internal connection pad IP10 enables a connection to the turn L10. Like previously, the coil A10 comprises a bypass area BA10 wherein each turn L1 to L10 bypasses the external connection pad EP1 via the central area CA. The outer turn L1 follows the entire contour of the antenna coil, with the exception of an area allowing the passage of a conductive track T1 outside the outer turn L1 and connecting the outer turn L1 to the connection pad EP1.

The wafer B10 also comprises holes h1 to h6 made from its rear face and opening onto the rear face of the contact pads C1 to C6 on the front face, without passing through them, and conductive rings r1 to r6 extending around the holes h1 to h6. The holes form a first row of holes h1 to h3 and a second row of holes h4 to h6 perpendicular or substantially perpendicular to a longitudinal axis of the wafer. Like previously, in some embodiments the holes may not be perfectly aligned, in which case their alignment axis is defined as an axis that passes as close as possible to the center of each hole.

The wafer B10 also comprises a support structure SS10, herein substantially π-shaped, comprising a first branch b1 and a second branch b2 parallel to each other, a third transverse branch b3 connecting the branches b1, b2, three branches b4 parallel to the branch b3 and attached to the branch b1, and three branches b5 parallel to the branch b3 and attached to the branch b2.

The turns of the second group of turns L7-L10 comprise portions of turns that are at a greater distance from the turn of the previous rank than the distance between turns dl of the first group of turns L1-L6. In particular, as depicted in FIG. 11B, the turns L7-L10 comprise a first group CA1 of portions of turns spaced apart by the distance between turns dl, the portion of the turn L7 of the group CA1 being spaced from the turn L6 by a distance d31 that is several times greater than the distance dl. After the group CA1, the turns L7-L10 comprise a group CA2 of portions of turns perpendicular to the portions of turns of the group CA1 and spaced apart by the distance between turns dl, the portion of the turn L7 of the group CA2 being spaced from the turn L6 by the distance dl. After the group CA2, the turns L7-L9 comprise a group CA3 of portions of turns perpendicular to the portions of turns of the group CA2 and spaced apart by the distance between turns dl, the portion of the turn L7 of the group CA3 being spaced from the turn L6 by the distance dl. The turn L10 then comprises a portion of turn 40 perpendicular to the portions of turn of the group CA2, which connects the portion of the turn L10 of the group CA2 to a branch b4 of the support structure SS10 (FIGS. 11A and 11B together). After the group CA3, the turns L7-L10 comprise a group CA4 of portions of turns perpendicular to the portions of turns of the group CA3 and spaced apart by the distance between turns dl.

The portion of the turn L7 of the group CA4 is spaced from the turn L6 by the distance dl. The portion 40 of the turn L10 is spaced from the portion of the turn L9 of the group CA3 by a distance d32 which is several times greater than the distance dl. The turn L10 also comprises a portion of turn 41 perpendicular to the portions of turns of the group CA4 and which connects the portion of the turn L10 of the group CA4 to a branch b5 of the support structure SS10. The portion 41 of the turn L10 is at the distance d32 from the portion of the turn L9 of the group CA3 (FIGS. 11A and 11B together). After the group CA4, the turns L7-L8 comprise a group CA5 of portions of turns perpendicular to the portions of turns of the group CA4 and spaced apart by the distance between turns dl, the portion of the turn L7 of the group CA5 being spaced from the turn L6 by the distance dl. The portions of turns L7-L8 of the group CA5 reach the bypass area BA10. Still after the group CA4, the turns L9-L10 comprise a group CA6 of portions of turns perpendicular to the portions of turns of the group CA4 and spaced apart by the distance between turns dl, the portion of the turn L9 of the group CA6 being spaced from the portion of the turn L8 of the group CA5 by a distance d33 several times greater than the distance dl. The portion of the turn L10 of the group CA6 terminates at the connection terminal IP10.

After the bypass area, the portions of turns of the group CA1 of turns L7 to L10 follow a path that passes between the holes h1 and h2 and their conductive rings r1, r2. The portions of turns of the group CA6 of turns L9 and L10 follow a path that passes between the holes h4 and h5 and their conductive rings r4, r5.

Part of the support structure SS10 therefore forms part of the conductive path of the turn L10. However, the conductive rings r1 to r6 are only attached to portions of the turns and are not part of the conductive paths of the turns.

According to the second improvement, the conductive layer on the rear face is etched to form, in the bypass area BA10, at least one pad for connecting to a turn of higher rank than the turn L1 of the first group of turns L1-L6.

More specifically, the antenna coil A10 herein comprises a pad EP2 for connection to the turn L2, a pad EP3 for connection to the turn L3, a pad EP3 for connection to the turn L3, a pad EP4 for connection to the turn L4, a pad EP5 for connection to the turn L5, and a pad EP6 for connection to the turn L6. The connection pads EP2 to EP6 are substantially circular and have, for example, a diameter of the order of 300 micrometers for a turn width of the order of 80 micrometers and a distance between turns of the order of 80 micrometers. The connection pads EP2 to EP6 are formed in the bypass area BA10 by maintaining the distance between turns dl between the connecting pads EP2 to EP6 and the adjacent turns, so that the portions of turns L1-L10 in the bypass area have "bulges" forming circular arcs of increasing diameter towards the outside of the bypass area.

Optionally but preferentially, the conductive layer is also etched so as to form at least one pad for connecting to a turn of lower rank than the turn L10 of the second group of turns L7-L10. The antenna coil A10 herein comprises two pads IP9*a,* IP9*b* for connection to the turn L9, a pad IP8 for connection to the turn L8 and a pad IP7 for connection to the turn L7. The pad IP9*a* is attached to the portion of the turn L9 of the group CA1 and the pad IP9*b* is attached to the portion of the turn L9 of the group CA6. The pads IP7, IP8 are attached to the portions of the turns L7, L9 of the group CA1.

The second improvement can therefore provide additional pads for connecting to the turns of the first group, or simultaneously pads for connecting to the turns of the first group and to the turns of the second group, as is depicted herein.

Figure 11C:
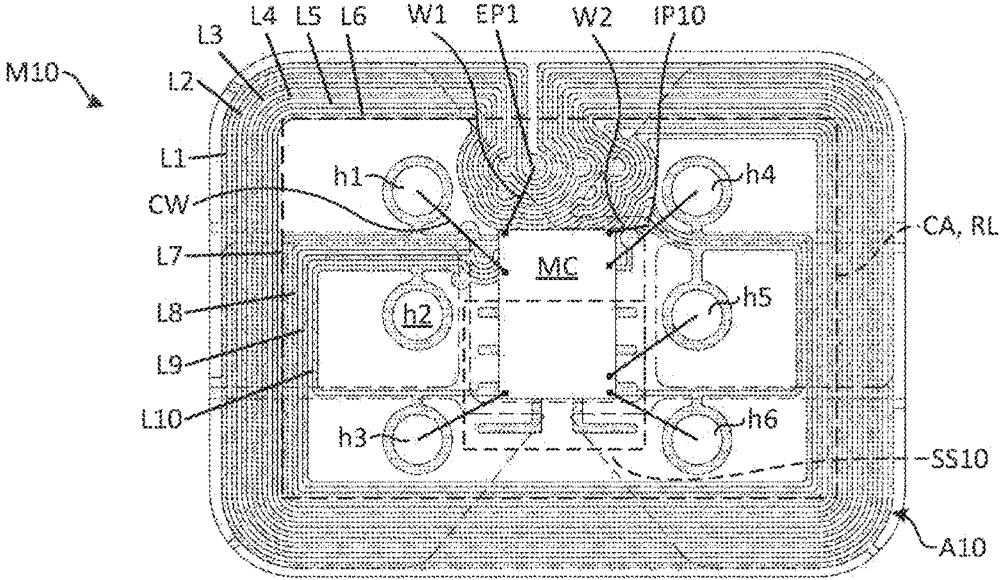

FIG. 11C shows a contactless module M10 made from the wafer B10. A microcircuit MC was attached to the wafer B10. The first connection terminals of the microcircuit were connected by wires W1, W2 to the external EP1 and internal IP10 connection pads of the antenna coil A10. Second connection terminals of the microcircuit were connected to the contact pads C1 and C3 to C6 on the front face (FIG. 12) by wires CW passing through the holes h1, h3 to h6. The microcircuit MC rests over part of its length and its entire width on the support structure SS10, and over another part of its length and its entire width on portions of the turns L7 to L10 in the bypass area. The central area CA of the antenna coil A10, delimited herein by the contour of the turn L6, was covered with a resin layer RL providing mechanical protection for the wires W1, W2, CW.

Figure 11D:
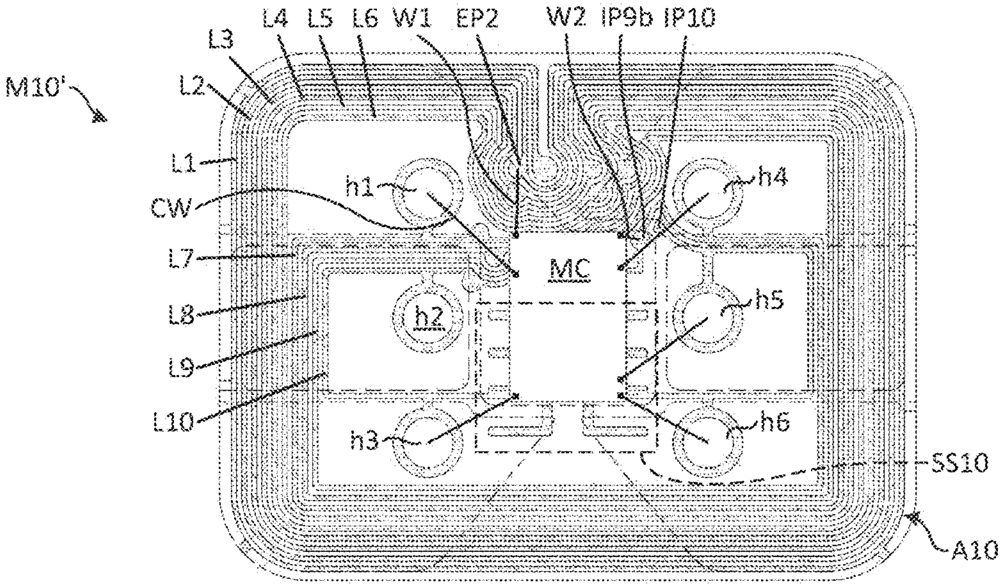

FIG. 11D shows another contactless module M10' made from the wafer B10. A microcircuit MC was attached to the wafer B10. The first connection terminals of the microcircuit were connected by wires W1, W2 to the connection pad EP2 of the turn L2, and to the connection pad IP9*b* of the turn L9. Thus, the turn L1 and the turn L10 are not part of the antenna coil A10 as seen from the connection terminals of the microcircuit.

Figure 13:
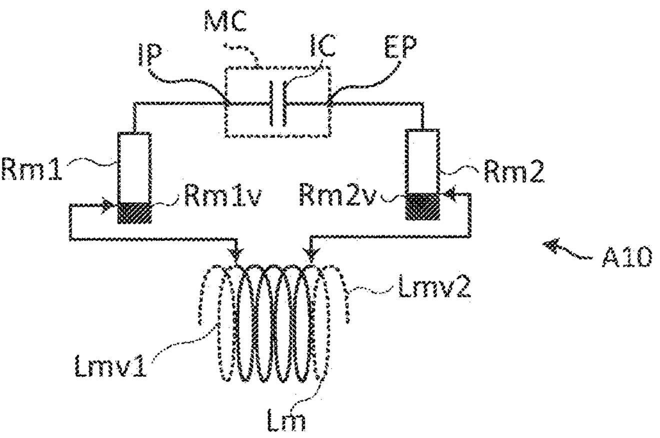
FIG. 13 is the wiring diagram of an antenna circuit for the contactless module of FIG. 11C or FIG. 11D.

As shown in FIG. 13, the choice of the terminal for connection to a turn of the first group L1-6 makes it possible to vary a part Lmv1 of the inductance L of the antenna coil seen by the microcircuit. The choice of the terminal for connection to a turn of the second group L7-L10 makes it possible to vary a part Lmv2 of the inductance L of the antenna coil seen by the microcircuit. Variable parts Rm1, Rm2 of the serial resistance of the antenna coil as seen by the microcircuit correspond to these variable parts of the inductance of the antenna coil.

Figure 14:
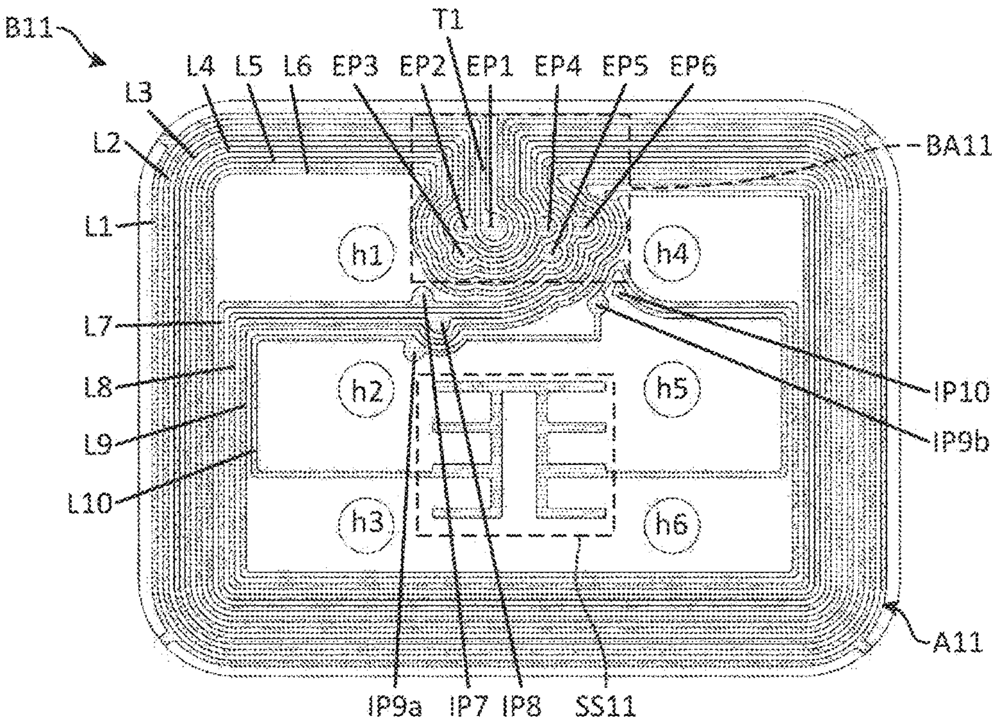
FIG. 14 shows the rear face of a variant of the wafer of FIG. 11A.

FIG. 14 shows a variant B11 of the wafer B10, comprising an antenna coil A11 of the same general structure as the antenna coil A10, with a support structure SS11 identical to the support structure SS10 and a bypass area BA11 identical to the bypass area BA10. The wafer B11 differs from the wafer B10 in that the periphery of the holes h1 to h6 is devoid of conductive rings. Alternatively, in some embodiments, the first row of holes h1 to h3 and/or the second row of holes h4 to h6 may comprise only two holes instead of three. Indeed, according to the applications, some holes may not be used to connect the microcircuit to contact pads on the front face, as can be seen for example in FIG. 11D, wherein the hole h2 is not used.

Figure 15:
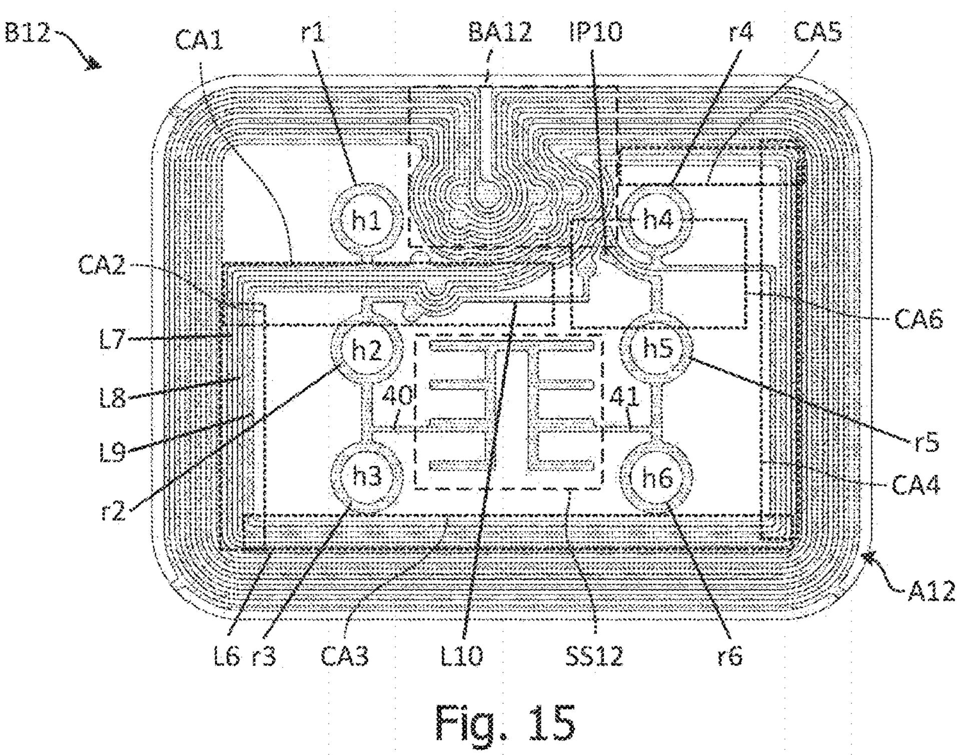
FIG. 15 shows the rear face of another variant of the wafer of FIG. 11A.

Various other variants of the wafer B10 can be used to create a contactless micromodule. FIG. 15 shows a variant B12 of the wafer B10, comprising an antenna coil A12 which resembles the antenna coil A10, with a support structure SS12 identical to the support structure SS10 and a bypass area BA12 identical to the bypass area BA10. The wafer B12 differs from the wafer B10 in that certain conductive rings, herein the conductive rings r2 and r5, are part of the conductive path of the turn L10. Thus, the portion of the turn L10 of the group CA2 is connected to the ring r2, which is connected to the support structure SS12 via the portion 40. The portion 41 of the turn L10 is connected to the conductive ring r5, which in turn is connected to the portion L10 of the group CA6, terminating at the connection pad IP10.

Figure 16:
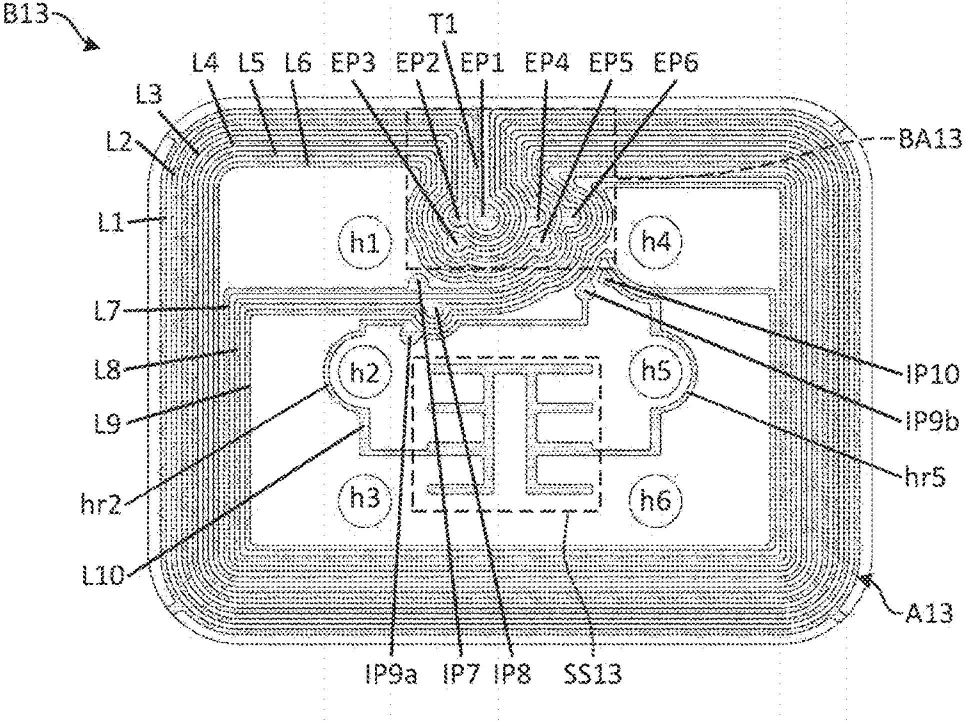
FIG. 16 shows the rear face of yet another variant of the wafer of FIG. 11A.

FIG. 16 shows a variant B13 of the wafer B12, wherein the conductive rings r1, r3, r4, r6 are omitted. The conductive ring r2 is replaced by a semi-circular track section hr2 and the conductive ring r5 is replaced by a semi-circular track section hr5, with both semi-circular track sections being part of the conductive path of the turn L10.

Figure 17:
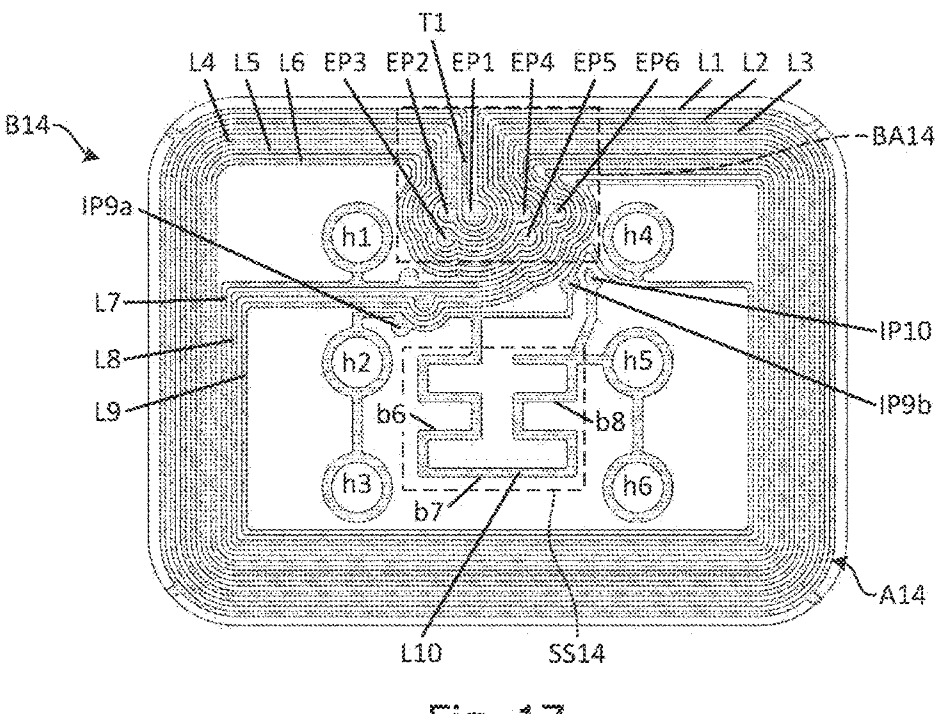
FIG. 17 shows the rear face of yet another variant of the wafer of FIG. 11A.
Figure 18:
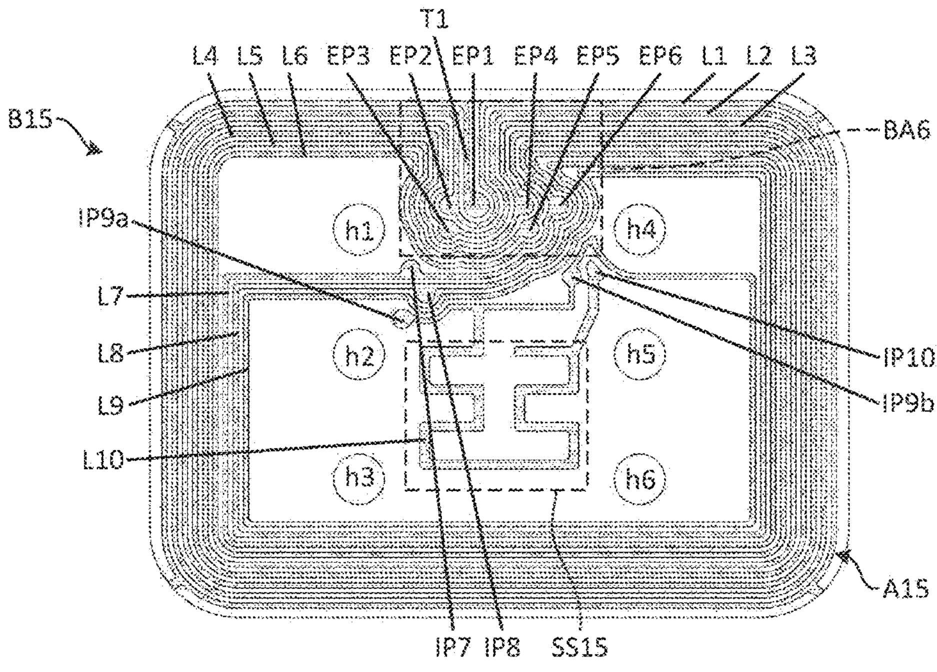
FIG. 18 shows the rear face of yet another variant of the wafer of FIG. 11A, FIGS. 19A and 19B show a step of a method for manufacturing a wafer of a contactless module.

FIG. 17 shows a variant B14 of the wafer B12, wherein the turn L10 forms a support structure SS14 comprising two crenellated conductive track sections b6, b8 and a straight section b7 connecting the two sections b6, b8. The section b6 is connected to the pad IP9*a* of the turn L9 and the section b8 is connected to the pad IP10 of the turn L10. The conductive rings extending around the holes h1 to h6 are connected to the turns of the antenna coil, but are not part of the conductive paths formed by these turns. In one variant B15 of the wafer B14 shown in FIG. 18, these conductive rings are omitted. Like previously, contactless modules can be formed from these variants B13, B14 and B15 of the wafer B12.

Although the first and second improvements of an antenna coil structure described hereinbefore are of particular interest in the context of a contactless module with two operating modes, so that the presence of the holes h1 to h6 was taken into account in the design of the antenna coil structure in the preceding examples, it will be clear to those skilled in the art that certain features of these improvements are not linked to the provision of contact pads on the front face of the module.

The implementation of a method for manufacturing an antenna coil according to the first improvement may comprise a step of designing the antenna coil comprising a preliminary step of determining at least one target value L of the inductance Lm of the antenna coil and one target value R of the resistance Rm of the antenna coil as they should be seen from the first connection terminals of the microcircuit. This is followed by a step of computer-aided design of the first and second groups of turns, in such a way that the inductance Lm and resistance Rm of the antenna coil as seen by the microcircuit are close to the intended values L and R.

The implementation of a method for manufacturing an antenna coil according to the second improvement may comprise a step of designing the antenna coil comprising a preliminary step of determining a plurality of target values L1, L2, L3, etc. of the inductance Lm of the antenna coil and of target values R1, R2, R2, etc. of the resistance Rm of the antenna coil as they should be seen by the microcircuit. This is followed by a step of computer-aided design of the first group of turns and the second group of turns, which comprises providing several pads for connecting to turns of different rank of the first group of turns and/or the second group of turns, so that the antenna coil has several pairs of connection pads. Each pair of connection pads comprises a pad for connecting to a turn of the first group of turns and a pad for connecting to a turn of the second group of turns. The design of the first and second groups of turns and the choice of the location of the connection terminals are carried out in such a way that the inductance Lm and the resistance Rm of the antenna coil as seen from each pair of connection pads of the antenna coil are close to one of the values of the plurality of target values L1, L2, L3, etc. of the inductance Lm and of target values R1, R2, R3, etc. of the resistance Rm of the antenna coil.

To implement these design steps, it may be advisable to provide a turn width and a distance between turns equal to the lower limits offered by the method for etching the conductive layer, this turn width generally being greater than the skin thickness of the conductive material used, and then to seek the highest inductance between the connection terminals of the outer turn and the inner turn, in order to obtain the widest possible range of inductances by virtue of the intermediate connection pads.

Furthermore, it will be clear to the skilled person that the second improvement can be implemented without the first improvement, for example in an antenna structure comprising only a single group of turns, by providing a connection terminal for each turn in the bypass area. This can be, for example, the antenna coil A14 of FIG. 17, lacking turns L7, L8 and L9, with the turn L10 becoming the turn L7.

Figures 19A, 19B, 20, 21:
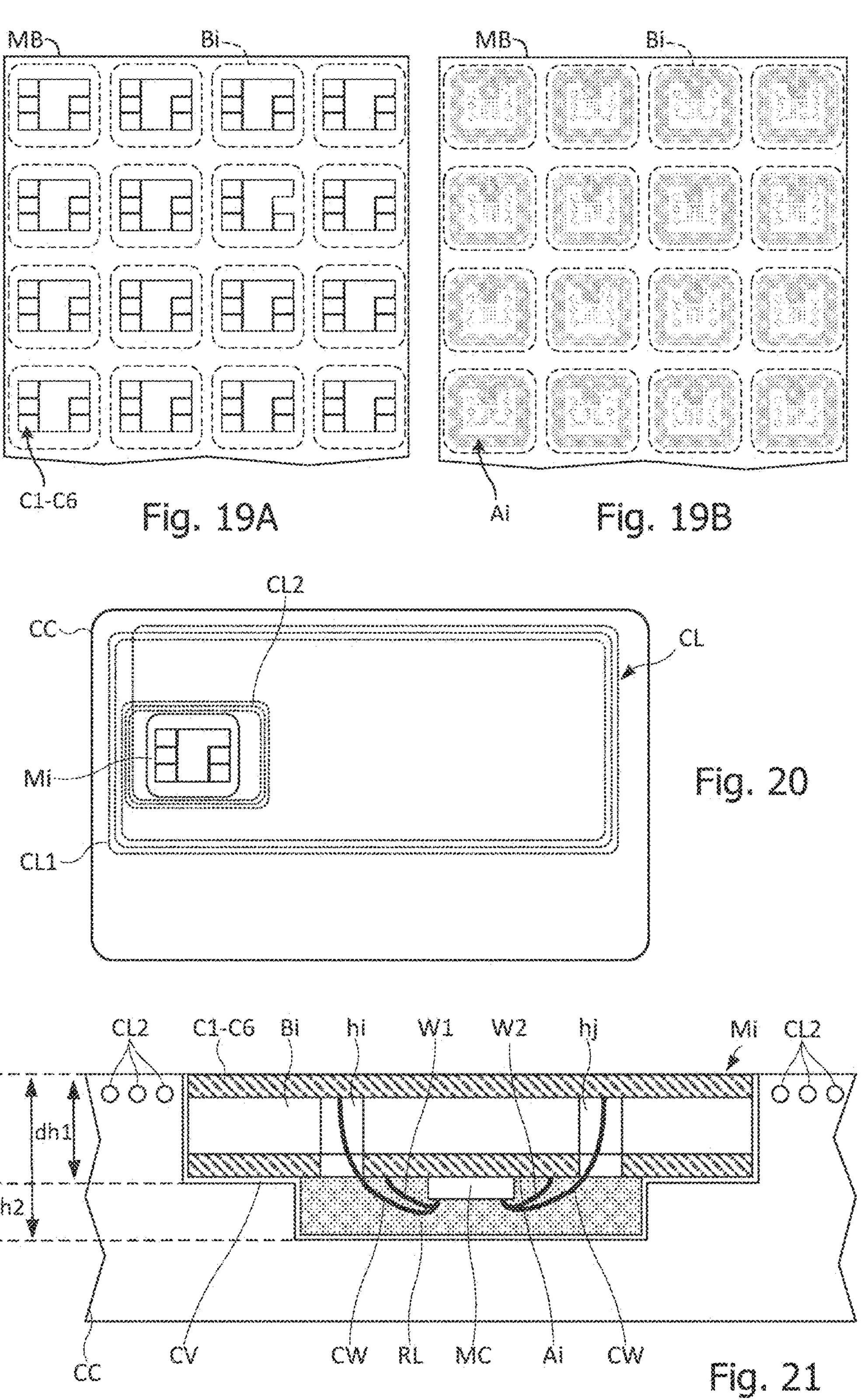
FIG. 20 shows a card equipped with a contactless module.
FIG. 21 is a cross sectional view of the smart card of FIG. 20.

According to one embodiment illustrated in FIG. 19 (FIGS. 19A, 19B), wafers Bi are produced collectively by etching a board MB covered on each face with an electrically conductive layer. The board can be a double-sided printed circuit board. FIGS. 19A and 19B depict the front and rear faces of part of the board MB after etching on both sides. In FIG. 19A, the board MB comprises several sets of contact pads C1-C6. The sets of contact pads C1-C6 are arranged in rows and columns on the board MB. In FIG. 19B, several coils Ai are formed on the rear face of the board MB, each coil facing one set of contact pads C1-C6.

In a subsequent step (not shown), the board MB can be drilled from the rear in the central area of each coil Ai to form holes in the board reaching the contact pads C1-C6. A microcircuit can be placed at the center of each coil Ai, and then connected by wires to the contact pads C1-C6 and to the coil Ai. The resin layer RL described hereinbefore is then deposited in order to protect each microcircuit with its connection wires without covering all or part of the turns of the antenna coils Ai. For this purpose, several techniques well known to the skilled person can be used:

- injection and thermal curing of an epoxy resin using molds, a dam & fill technique involving two UV-curable materials, potting, which consists of depositing a drop of material that is activated by heat or UV light. This technique is the least expensive, but is not very precise in terms of the thickness and surface area occupied by the resin layer.

In one variant, the board MB is drilled to form the holes h1-h6 before being covered with the front and rear conductive layers. In one exemplary embodiment, an epoxy-glass base substrate comprising a copper layer on its rear face has a copper layer added onto its front face with an adhesive layer positioned therebetween. The two copper-covered faces are then etched and drilled to form the two rows of holes h1-h6.

FIG. 20 shows a card CC comprising a contactless module Mi according to one or both of the improvements disclosed hereinbefore. FIG. 21 is a cross sectional view of the card CC. The card CC comprises a cavity CV receiving the module Mi, an antenna coil CL which is included in the body of the card and comprises one or more large turns CL1 and one or more small turns CL2. The small turns CL2 surround the module Mi and provide inductive coupling between the antenna coil Ai of the module Mi and the antenna coil CL. The contact pads C1-C6 and the antenna coil Ai of the module Mi are schematically depicted by a hatched layer in FIG. 21. FIG. 21 shows the wires CW of the module Mi passing through the holes hi, hj of the set of holes h1-h6, and the wires W1, W2 connecting the first connection terminals of the microcircuit MC to connection pads of the antenna coil Ai, as well as the resin layer RL that encapsulates the microcircuit and the wires W1, W2, CW.

The cavity CV has a first depth dh1 at its periphery, enabling it to receive the periphery of the contactless module Mi. The depth dh1 is preferably substantially less than the sum of the thickness of the wafer Bi from which the contactless module Mi is made, the thickness of an adhesive making it possible to attach the module Mi in the cavity, the thickness of the conductive layer forming the antenna coil Ai and the thickness of the conductive layer forming the contact pads C1-C6 on the front face, and is calculated in such a way that the contact pads C1-C6 protrude substantially beyond the surface of the card (typically from 10 to 50 micrometers).

The cavity CV also has a central region, the depth dh2 of which must be substantially greater than the sum of the first depth dh1 and the thickness of the resin layer RL, so that an empty space, for example 20 micrometers, remains to absorb the distance variations between the bottom of the cavity and the rear face of the module when the card is subjected to bending.

As mentioned above, the surface area of the central region of the cavity having the depth dh2 should preferably be as small as possible compared with the total surface area of the cavity, so as not to weaken the card. For this reason, it is desirable for the surface area of the module covered by the resin layer RL to be minimal. This minimal surface area corresponds substantially to the central region of the coil in which the wires W1, W2, CW extend, to which a safety border can be added.

The invention claimed is:

1. A method for manufacturing a contactless module, comprising the steps of:

depositing a first electrically conductive layer on a first face of a wafer;

forming an antenna coil by etching the first layer, the antenna coil including turns of increasing rank from the outside toward the inside of the antenna coil, including an outer turn of rank 1 and an inner turn of rank N, the inner turn being connected to an internal connection pad and the outer turn being connected to an external connection pad;

attaching a microcircuit to the first face of the wafer, in a central area of the antenna coil delimited by a turn of the antenna coil; and connecting first connection terminals of the microcircuit to connection pads of the antenna coil, via wires;

wherein the first layer is etched in such a way that the external and internal connection pads of the antenna coil are formed in the central area of the antenna coil, the antenna coil comprising a bypass area in which each turn bypasses the external connection pad via the central area, wherein the first layer is etched in such a way that:

the antenna coil comprises a first group of turns of ranks 1 to E, having substantially the same distance between turns, the turn of rank E being the inner turn of the first group of turns, E being at least equal to 4;

the central area is delimited by the contour of the inner turn of the first group of turns; and the antenna coil comprises a second group of at least two turns of ranks E+1 to N, which extends within the central area, each turn of the second group of turns comprising portions of turns which are at variable distances from the turn of preceding rank, said distances being comprised between said distance between turns and several times the distance between turns.

2. The method according to claim 1, further comprising the steps of:

depositing a second electrically conductive layer on a second face of the wafer;

forming contact pads in the second layer; and forming two rows of two or three holes each in the wafer, until the contact pads of the second layer are reached, the rows of holes being substantially perpendicular to a longitudinal axis of the contactless module, wherein the first layer is etched in such a way that all or some of the turns of the second group follow a path that passes between at least two holes of at least one row of holes.

3. The method according to claim 1, wherein the microcircuit is supported in whole or in part by at least the inner turn of the antenna coil and may also be supported by at least one turn portion of the first group of turns extending in the bypass area.

4. The method according to claim 1, wherein the conductive layer is etched so as to include a support structure for supporting all or part of the microcircuit, the support structure being electrically connected to the inner turn of the antenna coil.

5. The method according to claim 4, wherein at least one part of the support structure forms a conductive path that is part of the inner turn of the antenna coil.

6. The method according to claim 1, wherein the conductive layer is etched so as to form, in the bypass area, at least one connection pad for connecting to a turn of rank greater than 1 of the first group of turns.

7. The method according to claim 6, comprising a step that includes connecting a first one of the first connection terminals of the microcircuit to the connection pad of a turn of rank greater than 1 of the first group of turns.

8. The method according to claim 1, wherein the conductive layer is etched so as to form, in the central area, at least one connection pad for connecting to a turn of rank lower than N of the second group of turns.

9. The method according to claim 8, comprising a step that includes connecting a second one of the first connection terminals of the microcircuit to the connection pad of a turn of rank lower than N of the second group of turns.

10. The method according to claim 1, comprising a step of depositing an electrically insulating protective layer on the microcircuit and the connection wires.

11. The method according to claim 1, wherein the wafer belongs to a board wherein several contactless modules are collectively formed, the method comprising a step of cutting the board to individualize the several contactless modules, carried out after the connection of each microcircuit.

12. The method for manufacturing the contactless module according to claim 1, comprising a step of designing the antenna coil comprising:

- a step of determining at least one target value of the inductance and one target value of the resistance of the antenna coil as they should be seen from the first connection terminals of the microcircuit; and
- a step of designing the first group of turns and the second group of turns in such a way that the inductance and the resistance of the antenna coil, as seen from the connection pads of the antenna coil, are close to the intended target values.

13. The method for manufacturing the contactless module according to claim 1, comprising a step of designing the antenna coil comprising:

- a step of determining a plurality of target values of the inductance and of target values of the resistance of the antenna coil as they should be seen from the first connection terminals of the microcircuit; and
- a step of designing the first group of turns and the second group of turns, comprising the provision of several connection pads for connecting to turns of different ranks of the first group of turns and/or of the second group of turns, so that the antenna coil has several pairs of connection pads, each pair of connection pads comprising one pad for connecting to a turn of the first group of turns and one pad for connecting to a turn of the second group of turns,
- wherein the design of the first and second groups of turns and the choice of the location of the connection terminals are carried out in such a way that the inductance and resistance of the antenna coil as seen from each pair of connection pads of the antenna coil are close to one of the values of the plurality of target values of the inductance and of target values of the resistance of the antenna coil.

14. A method for manufacturing a microcircuit card comprising the steps of:

- carrying out the method according to claim 1, in order to obtain the contactless module;
- forming an antenna coil in a card; and
- implanting the contactless module in the card, the antenna coil of the card having at least one turn close to the antenna coil of the microcircuit in order to establish inductive coupling between the two antenna coils.

15. A contactless module, comprising:

- a wafer covered on a first face with a first electrically conductive layer in which an antenna coil is formed, the antenna coil including turns of increasing rank from the outside toward the inside of the antenna coil, including an outer turn of rank 1 and an inner turn of rank N, the inner turn being connected to an internal connection pad and the outer turn being connected to an external connection pad;
- a microcircuit attached to the first face of the wafer, in a central area of the antenna coil delimited by a turn of the antenna coil, and including first connection terminals connected to connection pads of the antenna coil via wires,
- wherein the external and internal connection pads of the antenna coil are formed in the central area of the antenna coil, the antenna coil comprising a bypass area wherein each turn bypasses the external connection pad via the central area, wherein:

- the antenna coil comprises a first group of turns of ranks 1 to E having substantially the same distance between turns, the turn of rank E being the inner turn of the first group of turns, E being at least equal to 4;
- the central area is delimited by the contour of the inner turn of the first group of turns;
- the antenna coil comprises a second group of at least two turns of ranks E+1 to N, which extends within the central area, each turn of the second group of turns comprising portions of turns which are at variable distances from the turn of preceding rank, said distances being comprised between said distance between turns and several times the distance between turns.

16. The contactless module according to claim 15, wherein the wafer comprises contact pads on a second face of the wafer, two rows of two or three holes each, made in the wafer, reaching the contact pads on the second face, the rows of holes being substantially perpendicular to a longitudinal axis of the contactless module, and wherein all or part of the turns of the second group of turns follow a path that passes between at least two holes of at least one row of holes.

17. The contactless module according to claim 15, wherein the microcircuit is supported in whole or in part by at least the inner turn of the antenna coil and may also be supported by at least one turn portion of the first group of turns extending in the bypass area.

18. The contactless module according to claim 15, wherein the conductive layer includes a support structure for supporting all or part of the microcircuit, the support structure being electrically connected to the inner turn of the antenna coil.

19. The contactless module according to claim 18, wherein at least one part of the support structure forms a conductive path that is part of the inner turn of the antenna coil.

20. The contactless module according to claim 15, wherein the antenna coil comprises, in the bypass area, at least one connection pad for connecting to a turn of rank greater than 1 of the first group of turns.

21. The contactless module according to claim 20, wherein a first one of the first connection terminals of the microcircuit (MC) is connected to the connection pad of a turn of rank greater than 1 of the first group of turns.

22. The contactless module according to claim 15, wherein the antenna coil comprises, in the central area, at least one connection pad for connecting to a turn of rank lower than N of the second group of turns, to which a second one of the first connection terminals of the microcircuit is connected or can be connected.

23. A microcircuit card comprising an antenna coil and the contactless module according to claim 15, the antenna coil of the card having at least one turn close to the antenna coil of the contactless module, in order to establish inductive coupling between the two antenna coils.

* * * * *